United States Patent
Hunt

(12) 
(10) Patent No.: US 6,909,308 B2
(45) Date of Patent: Jun. 21, 2005

(54) INCREASING DRIVE STRENGTH AND REDUCING PROPAGATION DELAYS THROUGH THE USE OF FEEDBACK

(75) Inventor: Kenneth S. Hunt, Finchampstead (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/228,172

(22) Filed: Aug. 26, 2002

(65) Prior Publication Data

US 2003/0214325 A1 Nov. 20, 2003

(30) Foreign Application Priority Data

May 20, 2002 (GB) .............................. 0211530

(51) Int. Cl.$^7$ .......................................... H03K 19/094
(52) U.S. Cl. ............................ 326/87; 326/31; 327/112
(58) Field of Search .............................. 326/83, 87, 27, 326/31; 327/112, 389, 387

(56) References Cited

U.S. PATENT DOCUMENTS

| | | | |
|---|---|---|---|
| 4,570,091 A | 2/1986 | Yasuda et al. | |
| 4,779,013 A * | 10/1988 | Tanaka | ........................ 326/27 |
| 4,829,199 A * | 5/1989 | Prater | ......................... 307/443 |
| 5,132,577 A | 7/1992 | Ward | |
| 5,166,555 A | 11/1992 | Kano | |
| 5,486,782 A * | 1/1996 | Chan | .......................... 327/112 |
| 5,739,715 A * | 4/1998 | Rawson | ....................... 327/387 |
| 6,040,713 A | 3/2000 | Porter et al. | ................... 326/83 |
| 6,044,027 A | 3/2000 | Zheng et al. | ................ 365/194 |
| 6,097,223 A | 8/2000 | Loughmiller | ................ 327/112 |
| 6,154,078 A | 11/2000 | Stave | .......................... 327/263 |
| 6,184,730 B1 * | 2/2001 | Kwong et al. | .............. 327/112 |
| 6,421,297 B1 | 7/2002 | Huber | ................... 365/230.06 |

* cited by examiner

Primary Examiner—Daniel Chang
(74) Attorney, Agent, or Firm—Fish & Neave IP Group; Evelyn C. Mak; Ropes & Gray LLP

(57) ABSTRACT

Techniques of increasing drive strength and reducing propagation delays of a digital logic circuit through the use of feedback are presented. Logic circuitry operative to receive an input signal of the digital logic circuit and a delayed version of an output signal of the digital logic circuit turns "ON" a supplemental drive transistor for a digital state transition of the output signal. The supplemental drive transistor provides supplemental drive current to the digital logic circuit during the output signal digital state transition, thus advantageously reducing propagation delay and increasing fan-out capability. The logic circuitry turns "OFF" the drive transistor once the output signal digital state transition is complete.

58 Claims, 15 Drawing Sheets

INCREASING DRIVE STRENGTH AND REDUCING PROPAGATION DELAYS THROUGH THE USE OF FEEDBACK

BACKGROUND OF THE INVENTION

This invention relates to circuits and methods for increasing drive strength and reducing propagation delays of a digital logic circuit. More particularly, this invention relates to circuits and methods for increasing drive strength and reducing propagation delays of a digital logic circuit through the use of feedback.

Drive strength of a digital logic circuit is a measure of the relative ability of that circuit to transition digital states. In particular, for an output signal voltage transition from a digital "1" to a digital "0", a digital logic circuit having high drive strength sources significant drive current that charges the output load capacitance of that circuit to a digital "1". Alternatively, for an output signal voltage transition from a digital "1" to a digital "0", a digital logic circuit having high drive strength sources significant drive current that discharges the output load capacitance of that circuit to a digital "0".

Because charging the output load capacitance requires a non-zero rise time, and because discharging the output load capacitance requires a non-zero fall time, digital logic circuits do not transition digital states instantaneously. Propagation delay is the time required for the output signal voltage of a digital logic circuit to transition digital states responsive to an input signal voltage transition. In particular, propagation delay for an output signal voltage transition from a digital "1" to a digital "0" is the time required to discharge the output load capacitance to a digital "0" responsive to an input signal voltage transition. Alternatively, propagation delay for an output signal voltage transition from a digital "0" to a digital "1", is the time required to charge the output load capacitance to a digital "1" responsive to an input signal voltage transition. Because transition times (i.e., rise time and fall time) of a digital logic circuit are inversely proportional to the drive strength (i.e., the amount of available drive current) of that circuit, digital logic circuits having higher drive strength generally exhibit advantageously lower propagation delays than digital logic circuits having lower drive strength.

Digital logic circuits having lower propagation delays have advantageously higher data throughput capability. In particular, because a digital logic circuit having lower propagation delays transitions digital states more quickly than a digital logic circuit having higher propagation delays, digital logic circuits having lower propagation delays can operate at desirably higher operating frequencies (which allow higher data throughput).

Further, as the complexity of integrated circuits continues to increase, a digital logic circuit is often required to drive an increased number of load devices (i.e., increased fan-out). Digital logic circuits having higher drive strength can advantageously drive a higher number of load devices than a digital logic circuit having lower drive strength.

In view of the foregoing, it would be desirable to provide circuits and methods for increasing drive strength and reducing propagation delays of a digital logic circuit.

SUMMARY OF THE INVENTION

It is an advantage of the invention to provide circuits and methods for increasing drive strength and reducing propagation delays of a digital logic circuit.

Circuitry for increasing drive strength of a digital logic circuit through the use of feedback is provided in accordance with the invention. Logic circuitry turns "ON" a supplemental drive transistor for an output signal digital state transition at an output terminal of the digital logic circuit. The supplemental drive transistor provides supplemental drive current to the digital logic circuit during the output signal digital state transition, thus advantageously reducing propagation delay and increasing fan-out capability of the digital logic circuit. For example, in one embodiment, a digital logic NAND gate turns "ON" a first drive transistor for an output signal digital state transition from a digital "0" to a digital "1" at the output terminal of the digital logic circuit, and a digital logic NOR gate turns "ON" a second drive transistor for an output signal digital state transition from a digital "1" to a digital "0" at the output of the digital logic circuit. A first input terminal of the logic circuitry is connected to an input terminal of the digital logic circuit. A second input terminal of the logic circuitry is connected to a delayed version of the output signal from the output terminal of the digital logic circuit. The logic circuitry turns "OFF" an "ON" drive transistor once the output signal digital state transition at the output terminal of the digital logic circuit is complete. In some embodiments, increased drive current is provided during an output signal transition from a digital "0" to a digital "1" only, or from a digital "1" to a digital "0" only.

A modified non-inverting two-stage CMOS circuit is provided in accordance with the invention. A logic inverter is connected to the input terminal of a known CMOS inverter. Logic circuitry turns "ON" a drive transistor operative to source supplemental drive current during an output signal digital state transition at an output terminal of the CMOS circuit and turns "OFF" the drive transistor once the output signal digital state transition is complete. For example, in one embodiment, a digital logic NAND gate turns "ON" a first drive transistor for an output digital state transition from a digital "0" to a digital "1" at the output terminal of the CMOS circuit, and digital logic NOR gate turns on a second drive transistor for an output digital state transition from a digital "1" to a digital "0" at the output terminal of the modified CMOS circuit. A first input terminal of the logic circuitry is connected to an input terminal of the modified CMOS circuit. A second input terminal of the logic circuitry is connected to a delayed version of the output signal from the output terminal of the modified CMOS circuit. In some embodiments, increased drive current is provided during an output signal transition from a digital "1" to a digital "0" only, or from a digital "0" to a digital "1" only. The modified non-inverting two-stage CMOS circuit provided in accordance with the invention has advantageously increased drive strength and reduced propagation delays in comparison to a stand-alone known non-inverting two-stage CMOS circuit.

Methods of increasing drive strength of a digital logic circuit through the use of feedback are provided in accordance with the invention. Responsive to determining that an input signal at an input terminal of the digital logic circuit has transitioned digital states, supplemental drive current is provided to the digital logic circuit during the corresponding output signal digital state transition at an output terminal of the digital logic circuit. In one embodiment, supplemental drive current is provided during an output signal transition from a digital "1" to a digital "0" at the output terminal of the digital logic circuit. In another embodiment, supplemental drive current is provided during an output signal transition from a digital "0" to a digital "1" at the output terminal of the digital logic circuit. Responsive to determining via a feedback path that the output signal digital state transition is complete, the supplemental drive current is no longer provided to the digital logic circuit. The supplemental drive current advantageously reduces propagation delay and increases fan-out capability of the digital logic circuit.

Methods of making a circuit operative to increase drive strength of a digital logic circuit are provided in accordance with the invention. Delay circuitry operative to receive and delay an output signal from an output terminal of the digital logic circuit is provided. Also provided is at least one drive transistor operative to source supplemental drive current to the digital logic circuit. Further, logic circuitry is provided. The logic circuitry has a first input terminal connected to an output terminal of the delay circuitry and a second input terminal connected to an input terminal of the digital logic circuit, and is operative to turn "ON" the drive transistor during an output signal digital state transition at the output terminal of the digital logic circuit and turn "OFF" the drive transistor once the output signal digital state transition is complete.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Techniques of increasing drive strength and reducing propagation delays of a digital logic circuit are presented. The techniques described herein can be applied to any semiconductor technology (e.g., emitter coupled logic ("ECL"), transistor-transistor logic ("TTL"), etc.). However, for purposes of clarity and brevity, the following detailed description is discussed in the context of complementary metal-oxide semiconductor ("CMOS") technology.

Figure 1:
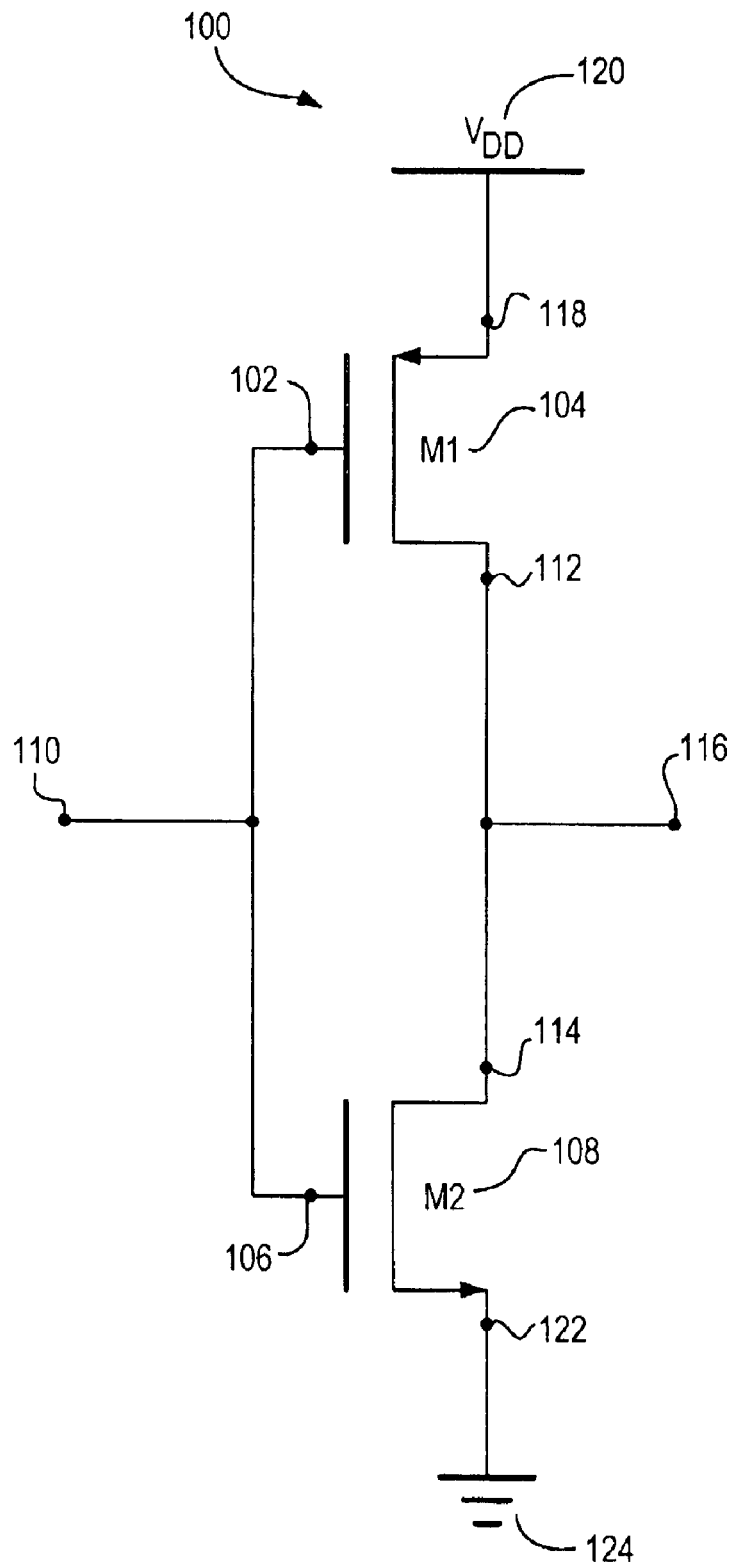
FIG. 1 is a circuit diagram of a known CMOS inverter.

FIG. 1 shows a known CMOS inverter 100. As shown, gate terminal 102 of-p-type transistor M1 104 and gate terminal 106 of n-type transistor M2 108 are connected at input node 110. Drain terminal 112 of transistor M1 104 and drain terminal 114 of transistor M2 108 are connected at output node 116. Source terminal 118 of transistor M1 104 is connected to supply voltage $V_{DD}$ 120. Source terminal 122 of transistor M2 108 is connected to ground 124. During steady-state circuit operation (i.e., circuit operation after transient switching current has settled), known CMOS inverter 100 outputs to output node 116 a digital invert of the input signal input to input node 110 (i.e., outputs a digital "1" for an input digital "0" or a digital "0" for an input digital "1"). In particular, an input signal voltage $V_{OL}$ representing a digital "0" turns "ON" transistor M1 104 (i.e., places transistor M1 104 in active mode of operation) and turns "OFF" transistor M2 108 (i.e., prevents M2 108 from sourcing current). Neglecting small leakage current that causes slightly non-ideal circuit behavior, transistor M1 104 can be ideally modeled as a small resistance and transistor M2 108 can be ideally modeled as an open-circuit during steady-state circuit operation.

Figure 2:
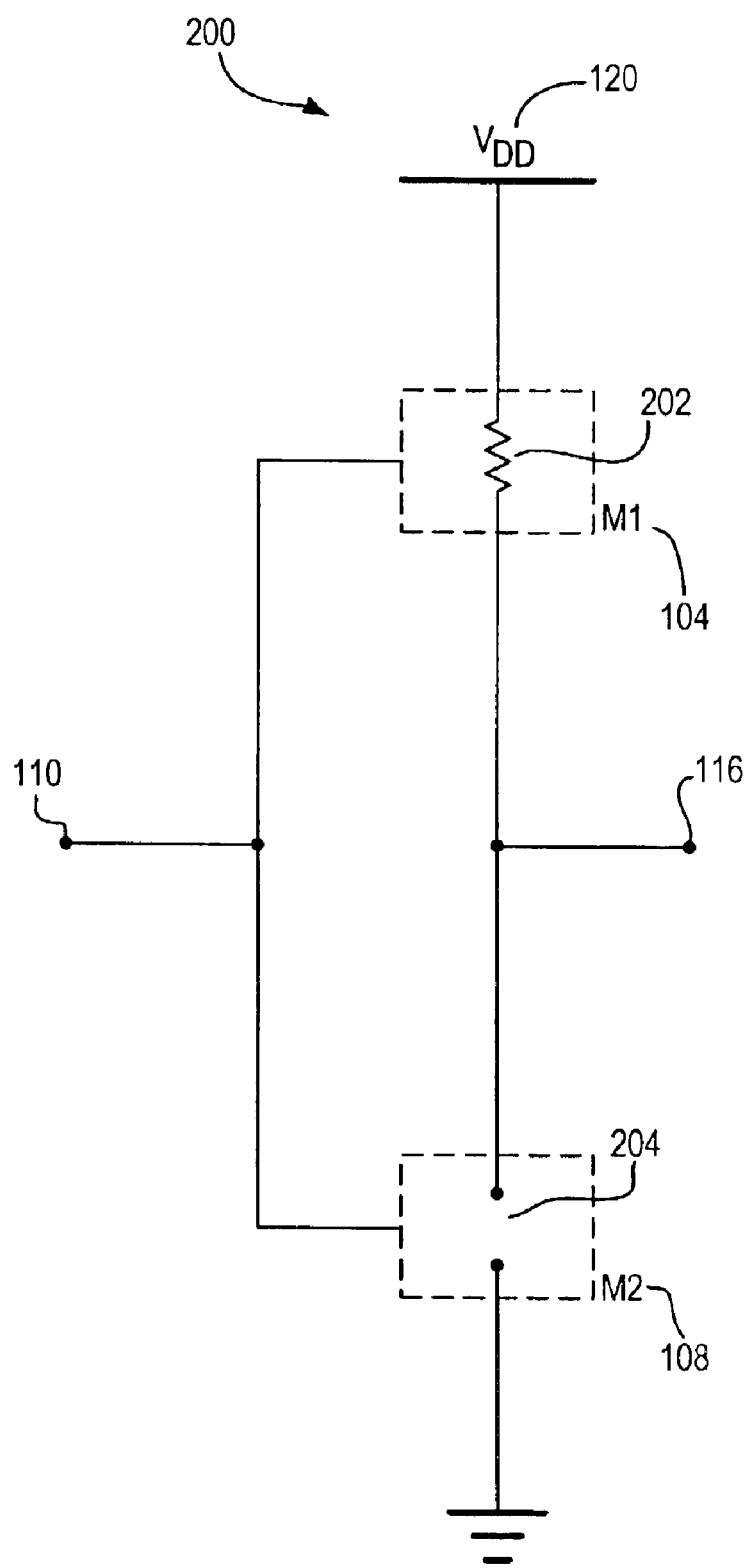
FIG. 2 is a circuit diagram showing steady-state circuit configuration of an ideally-modeled known CMOS inverter responsive to a digital "0" input.

FIG. 2 shows an ideal, steady-state circuit representation 200 of known CMOS inverter 100 responsive to a digital "0" input to input node 110. As shown, transistor M1 104 is ideally modeled as resistor 202 and transistor M2 108 is ideally modeled as open-circuit 204 (i.e., an infinite resistance). Accordingly, the voltage at output node 116 is "pulled up" to supply voltage $V_{DD}$ 120 (i.e., a digital "1") during steady-state circuit operation. Thus, known CMOS inverter 100 outputs to output node 116 a digital "1" responsive to a digital "1" input during steady-state circuit operation.

Alternatively, an input signal voltage $V_{OH}$ representing a digital "1" turns "ON" transistor M2 108 (i.e., places transistor M2 108 in active mode of operation) and turns "OFF" transistor M1 104 (i.e., prevents transistor M1 104 from sourcing current). Neglecting small leakage current that causes slightly non-ideal circuit behavior, transistor M2 108 can be ideally modeled as a small resistance and transistor M1 104 can be ideally modeled as an open-circuit during steady-state circuit operation.

Figure 3:
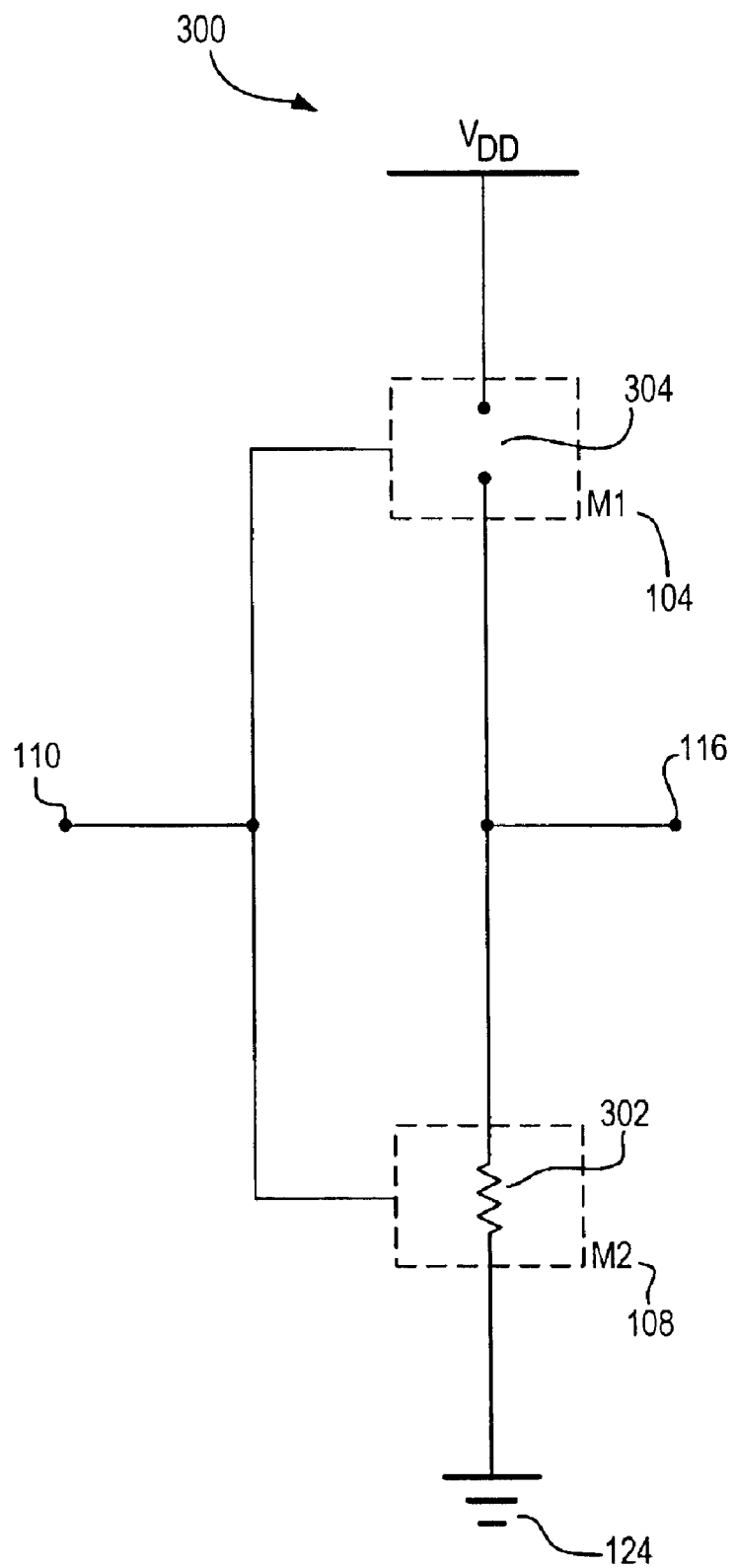
FIG. 3 is a circuit diagram showing steady-state circuit configuration of an ideally-modeled known CMOS inverter responsive to a digital "1" input.

FIG. 3 shows an ideal, steady-state circuit representation 300 of known CMOS inverter 100 responsive to a digital "1" input to input node 110. As shown, transistor M2 108 is ideally modeled as resistor 302 and transistor M1 104 is ideally modeled as open-circuit 304. Accordingly, the voltage at output node 116 is "pulled down" to ground 124 (i.e., a digital "0") during steady-state circuit operation. Thus, known CMOS inverter 100 outputs to output node 116 a digital "0" responsive to a digital "1" input during steady-state circuit operation.

Figure 4:
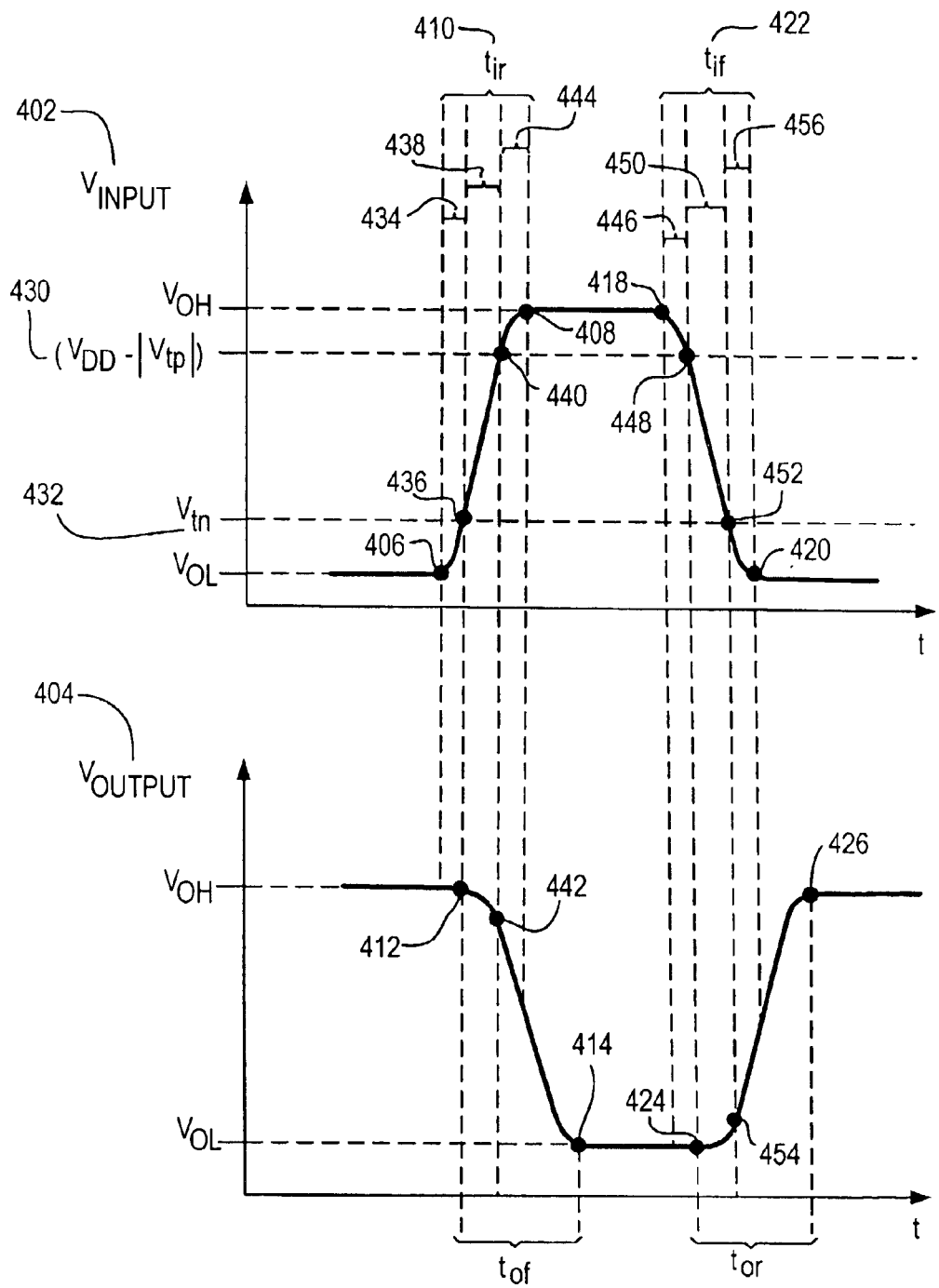
FIG. 4 is graph of input signal voltage and output signal voltage versus time for a known CMOS inverter during digital state transitions.

Returning to FIG. 1, input signal transitions at input node 110 and output signal transitions at output node 116 exhibit non-zero rise and fall times (i.e., input and output signal transitions are not instantaneous). For example, FIG. 4 shows an exemplary input signal voltage 402 and an exemplary output signal voltage 404 versus time for known CMOS inverter 100 (FIG. 1). As shown, a transition of input signal voltage 402 from voltage $V_{OL}$ 406 (digital "0") to voltage $V_{OH}$ 408 (digital "1") during input signal rise time ($t_{ir}$) 410 causes output signal voltage 404 to transition from voltage $V_{OH}$ 412 (digital "1") to voltage $V_{OL}$ 414 (digital "0") during output signal fall time ($t_{of}$) 416. Similarly, a transition of input signal voltage 402 from voltage $V_{OH}$ 418 (digital "1") to voltage $V_{OL}$ 420 (digital "0") during input signal fall time ($t_{if}$) 422 causes output signal voltage 404 to transition from voltage $V_{OL}$ 424 (digital "0") to voltage $V_{OH}$ 426 (digital "1") during output signal rise time ($t_{or}$) 428.

Referring to both FIGS. 1 and 4, total effective input capacitance of known CMOS inverter 100 determines input signal rise time 410 and input signal fall time 422. Total effective input capacitance is the combination of internal capacitances of transistors M1 104 and M2 108, capacitances induced by device interconnects (e.g., wires) to input node 110, and output capacitance of the source the input signal voltage (e.g., a function generator, another known CMOS inverter, other circuitry, etc.). In particular, input signal rise time 410 is the time required to charge the total effective input capacitance from $V_{OL}$ 406 to $V_{OH}$ 408 and input signal fall time 422 is the time required to discharge the total effective input capacitance from $V_{OH}$ 418 to $V_{OL}$ 420. Because internal capacitances are characteristic of transistors M1 104 and M2 108 (i.e., the internal capacitances cannot be removed), input signal voltage 402 at input node 110 will always exhibit non-zero rise time 410 and fall time 422.

Total effective output load capacitance of known CMOS inverter 100 determines output signal rise time 428 and output signal fall time 416. Total effective output load capacitance is the combination of internal capacitances of transistors M1 104 and M2 108, capacitances induced by device interconnects (e.g., wires) to output node 116, and input capacitances of any load devices. In particular, output signal rise time 428 is the time required to charge the total effective output load capacitance from $V_{OL}$ 424 to $V_{OH}$ 426 and output signal fall time 416 is the time required to discharge the total effective output load capacitance from $V_{OH}$ 412 to $V_{OL}$ 414. Because internal capacitances are characteristic of transistors M1 104 and M2 108, output signal voltage 404 at output node 116 will always exhibit non-zero rise time 428 and fall time 416. Additionally, because an increased number of load devices introduces an increased load capacitance (which increases total effective output load capacitance), a known CMOS inverter 100 with a significant number of load devices (i.e., high fan-out) exhibits a longer output signal rise time 428 and output signal fall time 416 than the same inverter 100 with fewer load devices.

Input signal voltage 402 at input node 110 determines various modes of operation of transistors M1 104 and M2 108 during input signal rise time 410 (i.e., during an input signal transition from a digital "0", ($V_{OL}$) 406 to a digital "1" ($V_{OH}$) 408). In particular, because input signal voltage 402 of input node 110 is below cut-off voltage 430 of transistor M1 104 (i.e., the voltage below which transistor M1 104 is "ON") and below threshold voltage $V_{tn}$ 432 of transistor M2 108 during a first interval 434 of input signal rise time 410 (i.e., from voltage 406 to voltage 436), transistor M1 104 is "ON" and transistor M2 108 is "OFF" during interval 434. Cut-off voltage 430 is supply voltage $V_{DD}$ 120 minus the threshold voltage ($V_{tp}$) of transistor M1 104 (i.e., $V_{DD}-|V_{tp}|$), where $V_{tp}$ is the minimum voltage induced between source terminal 118 and gate terminal 102 (i.e., $V_{SGP}$) that places transistor M1 104 in active mode of operation. Similarly, $V_{tn}$ 432 is the minimum voltage induced between gate terminal 106 and source terminal 122 (i.e., $V_{GSN}$) that places transistor M2 108 in active mode of operation. As shown, output signal voltage 404 is voltage $V_{OH}$ 412 (i.e., a digital "1") throughout interval 434.

During a second interval 438 of input signal rise time 410 (i.e., from voltage 436 to voltage 440), because input signal voltage 402 of input node 110 is above transistor M2 threshold voltage 432 and below transistor M1 cut-off voltage 430, both transistors M1 104 and M2 108 are "ON" (i.e., each transistor is either in triode mode or saturation mode of operation during clearly defined sub-intervals of interval 438). Additionally, because both transistors M1 104 and M2 108 conduct current during interval 438, and because a large portion of the current conducted by transistor M2 108 is provided by transistor M1 104 during interval 438, only a small portion of the current conducted by transistor M2 108 discharges the total effective output load capacitance during interval 438 (i.e., only a small portion of the current conducted by transistor M2 108 is drive current). In particular, simultaneous conduction by transistors M1 104 and M2 108 during interval 438 results in a significant "crowbar" current (i.e., current flowing from supply voltage $V_{DD}$ 120 to ground 124 via transistors M1 104 and M2 108) which prevents drive transistor M2 108 from sourcing significant drive current to discharge the total effective output capacitance during interval 438. This transistor "fighting" during interval 438 causes an undesirable delay (i.e., propagation delay) in the time required to discharge the total effective output load capacitance to a digital "0" (i.e., $V_{OL}$ 414), thus undesirably increasing output signal fall time 416. As shown, output signal voltage 404 drops to only voltage 442 (which is close to $V_{OH}$ 412) by the end of interval 438.

During a final interval 444 of input signal rise time 410 (i.e., as input signal voltage 402 rises from voltage 440 to voltage 408), because input signal voltage 402 at input node 110 (FIG. 1) is above transistor M2 threshold voltage 432 and above transistor M1 cut-off voltage 430, transistor M2 108 is "ON" and transistor M1 104 is "OFF". All of the current conducted by transistor M2 108 discharges the total effective output load capacitance during interval 444 (i.e., all of the current conducted by transistor M2 108 is drive current). As shown in FIG. 4, transistor M2 108 continues to discharge the total effective output capacitance after interval 444. However, transistor M2 108 stops conducting drive current once the output voltage reaches voltage $V_{OL}$ 414 (i.e., a digital "0").

Similarly, input signal voltage 402 at input node 110 (FIG. 1) determines various modes of operation of transistors M1 104 and M2 108 during input signal fall time 422 (i.e., during an input signal transition from a digital "1" ($V_{OH}$) 418 to a digital "0" ($V_{OL}$) 420). In particular, because input signal voltage 402 is above transistor M2 threshold voltage 432 and above transistor M1 cut-off voltage 430 during a first interval 446 of input signal fall time 422 (i.e., as input signal voltage 402 falls from voltage 418 to voltage 448), transistor M2 108 is "ON" and transistor M1 104 is "OFF"

during interval 446. As shown, output signal voltage 404 is voltage $V_{OL}$ 424 (i.e., a digital "0") throughout interval 446.

During a second interval 450 of input signal fall time 422 (i.e., as input signal voltage 402 falls from voltage 448 to voltage 452), because input signal voltage 402 is below transistor M1 cut-off voltage 430 and above transistor M2 threshold voltage 432, both transistors M1 104 and M2 108 are "ON" (i.e., each transistor is either in triode mode or saturation mode of operation during clearly defined sub-intervals of interval 450). Additionally, because both transistors M1 104 and M2 108 conduct current during interval 450, and because a large portion of the current conducted by transistor M1 104 is sunk by transistor M2 108 during interval 450, only a small portion of the current conducted by transistor M1 104 charges the total effective output load capacitance during interval 450 (i.e., only a small portion of the current conducted by transistor M1 104 is drive current). In particular, simultaneous conduction by transistors M1 104 and M2 108 during interval 450 results in a significant crowbar current which prevents drive transistor M1 104 from sourcing significant drive current to charge the total effective output load capacitance. Thus, this transistor "fighting" during interval 450 causes an undesirable delay (i.e., propagation delay) in the time required to charge the total effective output load capacitance to a digital "1" (i.e., $V_{OH}$ 426), thus undesirably increasing output signal rise time 428. As shown, output signal voltage 404 rises to only voltage 454 (which is close to $V_{OL}$ 424) by the end of interval 450.

During a final interval 456 of input signal fall time 422 (i.e., as input signal voltage 402 falls from voltage 452 to voltage 420), because input signal voltage 402 is below transistor M1 cut-off voltage 430 and below transistor M2 threshold voltage 432, transistor M1 104 is "ON" and transistor M2 108 is "OFF". All of the current conducted by transistor M1 104 charges the total effective output capacitance during interval 456 (i.e., all of the current conducted by transistor M1 102 is drive current). As shown in FIG. 4, transistor M1 104 continues to charge the total effective output capacitance after interval 456. However, transistor M1 104 stops conducting drive current once the output voltage reaches voltage $V_{OH}$ 426 (i.e., a digital "1").

Figure 5:
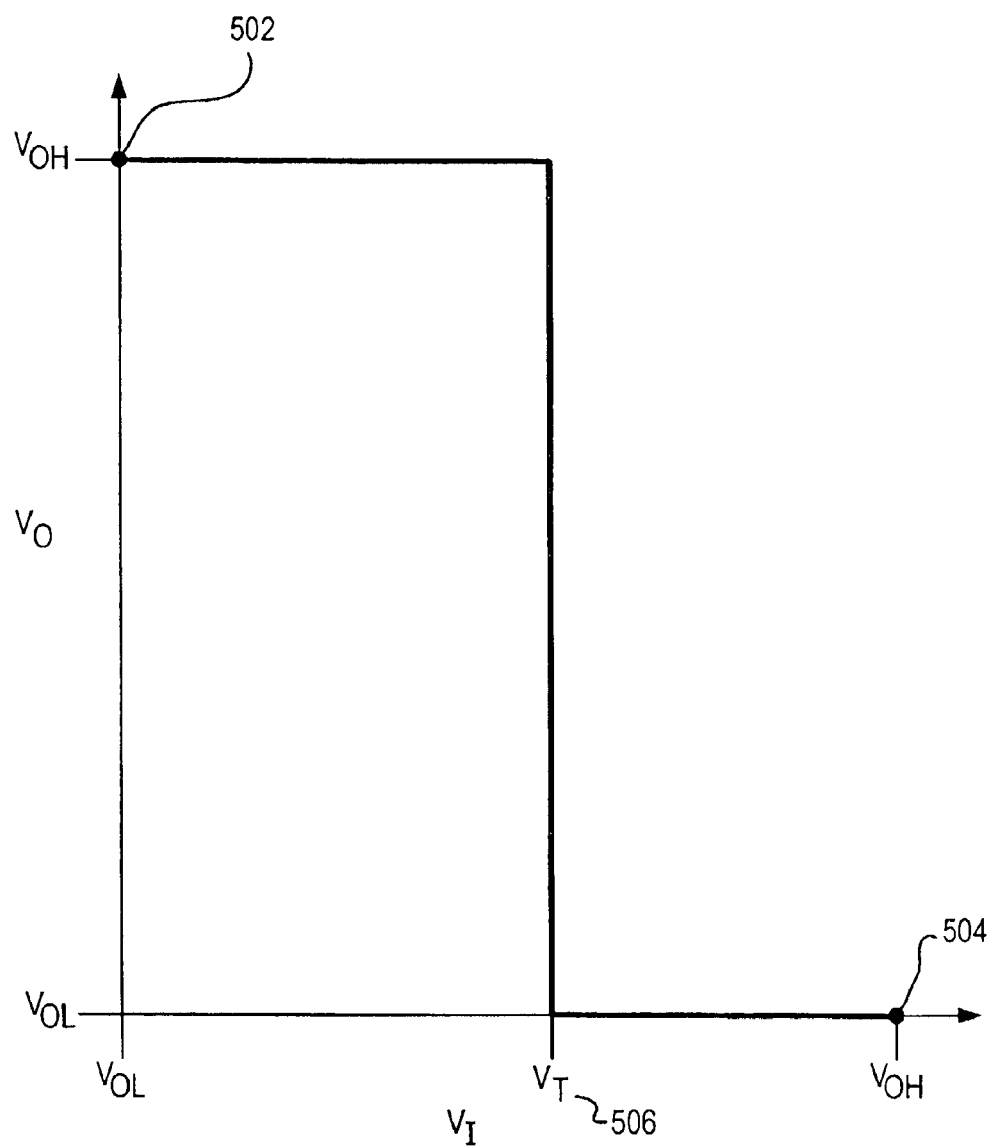
FIG. 5 is a graph of an ideal input/output signal voltage transfer characteristic of a known CMOS inverter.

Referring to both FIGS. 1 and 5, FIG. 5 shows an ideal input/output signal voltage transfer characteristic 500 for known CMOS inverter 100. As shown by point 502, an input signal voltage ($V_I$) of $V_{OL}$ (i.e., a digital "0") results in an output signal voltage ($V_O$) of $V_{OH}$ (i.e., a digital "1") during steady-state circuit operation. Alternatively, as shown by point 504, an input signal voltage of $V_{OH}$ results in an output signal voltage of $V_{OL}$ during steady-state circuit operation. During digital state transitions, the output signal voltage transitions digital states once the input signal voltage has passed trip voltage ($V_T$) 506 of known CMOS inverter 100. In particular, the output signal voltage of known CMOS inverter 100 transitions from a digital "1" to a digital "0" once the input signal voltage exceeds trip voltage 506 and transitions from a digital "0" to a digital "1" once the input signal voltage falls below trip voltage 506. If transistors M1 104 and M2 108 are matched (i.e., if the equation $(W_p/W_n) = (u_n/u_p)$ is satisfied, where $W_p$ is the channel width and $u_p$ is the mobility of holes of transistor M1 104, and $W_n$ is the channel width and $u_n$ is the mobility of electrons of transistor M2 108), transfer characteristic 500 will be symmetric (i.e, $V_T = (V_{OH} + V_{OL})/2$, as shown in FIG. 5). If transistor M1 104 is the dominant transistor (i.e., if $(W_n*u_n) > (W_p*u_p)$), transfer characteristic 500 will be shifted to the right (i.e. trip voltage 506 will be a greater voltage value). Alternatively, if transistor M2 108 is the dominant transistor (i.e., if $(W_p*u_p) > (W_n*u_n)$), transfer characteristic 500 will be shifted to the left (i.e., trip voltage 506 will be a lesser voltage value).

Figure 6:
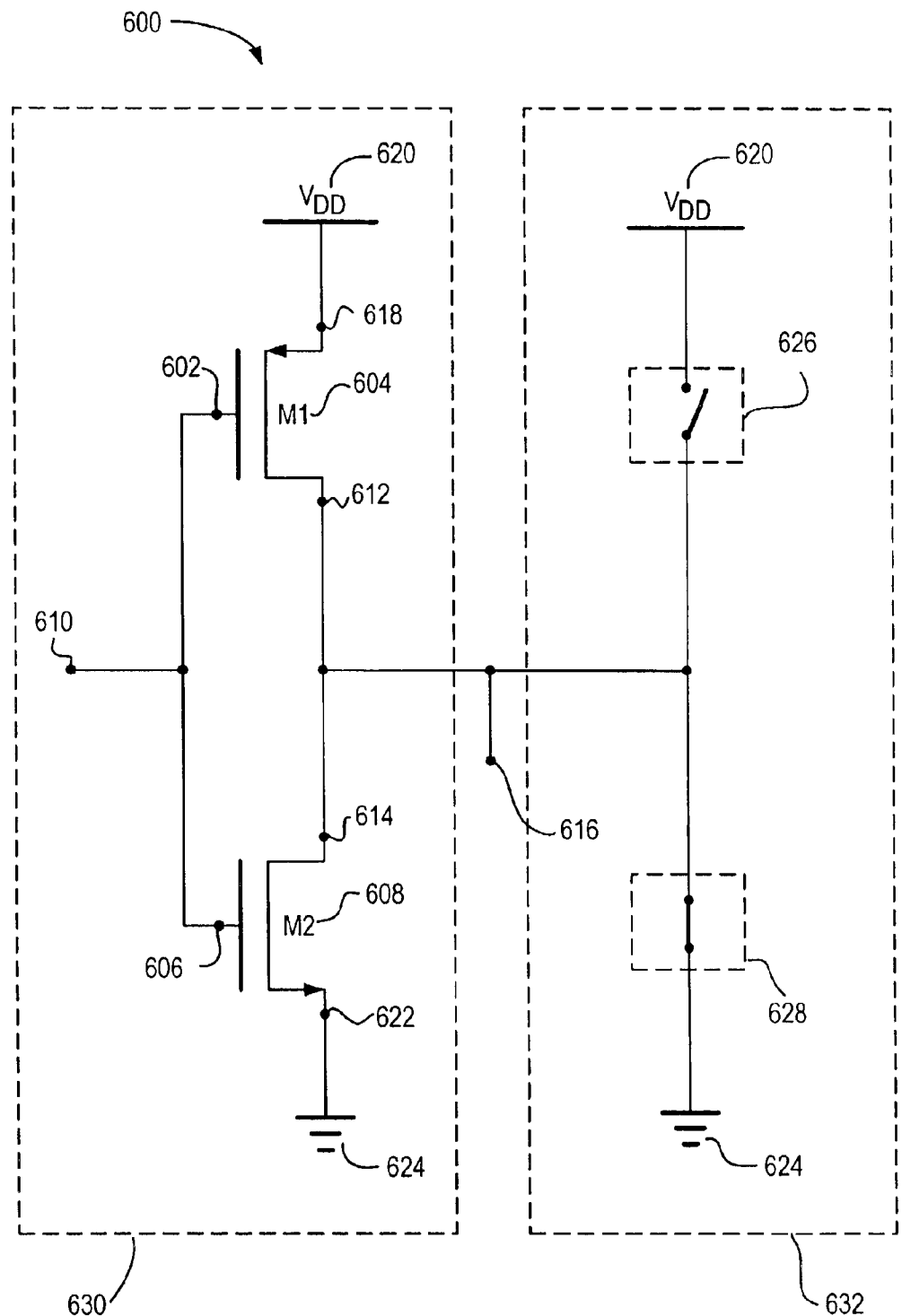
FIG. 6 is a circuit diagram of a modified CMOS inverter showing circuit configuration for an output signal voltage transition from a digital "1" to a digital "0" according to the invention.

FIG. 6 shows a modified CMOS inverter 600 in accordance with the invention. As shown, gate terminal 602 of p-type transistor M1 604 and gate terminal 606 of n-type transistor M2 608 are connected at input node 610. Drain terminal 612 of transistor M1 604 and drain terminal 614 of transistor M2 608 are connected at output node 616. Source terminal 618 of transistor M1 604 is connected to supply voltage $V_{DD}$ 620. Source terminal 622 of transistor M2 608 is connected to ground 624. Switch 626 (e.g., a p-type transistor) makes a series connection between supply voltage $V_{DD}$ 620 and output node 616. Switch 628 (e.g., an n-type transistor) makes a series connection between ground 624 and output node 616. Similar to operation of known CMOS inverter 100 (FIG. 1), modified CMOS inverter 600 outputs to output node 616 a digital invert of the input signal input to input node 610 during steady-state operation (i.e., outputs a digital "1" for an input digital "0" or a digital "0" for an input digital "1"). However, in comparison to known CMOS inverter 100 (FIG. 1), modified CMOS inverter 600 has advantageously increased drive strength and reduced propagation delays. Because increased drive strength corresponds to increased available drive current, modified CMOS inverter 600 can advantageously drive a higher number of load devices (i.e., higher fan-out capability) than known CMOS inverter 100. Additionally, because reduced propagation delay results in desirably faster switching times (i.e., output rise and fall times), modified CMOS inverter 600 can operate at desirably higher operating frequencies (which produce desirably higher data throughput) than known CMOS inverter 100.

Both the input voltage of input node 610 and the output voltage of output node 616 determine operation of switches 626 and 628 (i.e., whether they are open or closed) via feedback circuitry (not shown). Feedback circuits and methods are described in detail in subsequent sections of this disclosure. In particular, during steady-state circuit operation, both switch 626 and switch 628 are open. Alternatively, for an output signal voltage transition from a digital "1" to a digital "0" at output node 616 (i.e., responsive to an input signal voltage transition from a digital "0" to a digital "1" at input node 610), switch 626 is open and switch 628 is closed. This circuit configuration provides reduced propagation delay (i.e., in comparison to known CMOS inverter 100) for the output signal voltage transition from a digital "1" to a digital "0", thus reducing output signal fall time. For an output signal voltage transition from a digital "0" to a digital "1" (i.e., responsive to an input signal voltage transition from a digital "1" to a digital "0"), switch 628 is open and switch 612 is closed. This circuit configuration provides reduced propagation delay for the output signal voltage transition from a digital "0" to a digital "1", thus reducing output signal rise time.

FIG. 6 shows operation of switches 626 and 628 of modified CMOS inverter 600 for an output signal voltage transition from a digital "1" to a digital "0" at output node 616. As shown, switch 626 is open and switch 628 is closed. Switch 626 can be ideally modeled as an open-circuit and switch 628 can be ideally modeled as a finite resistance in the circuit configuration of FIG. 6.

Figure 7:
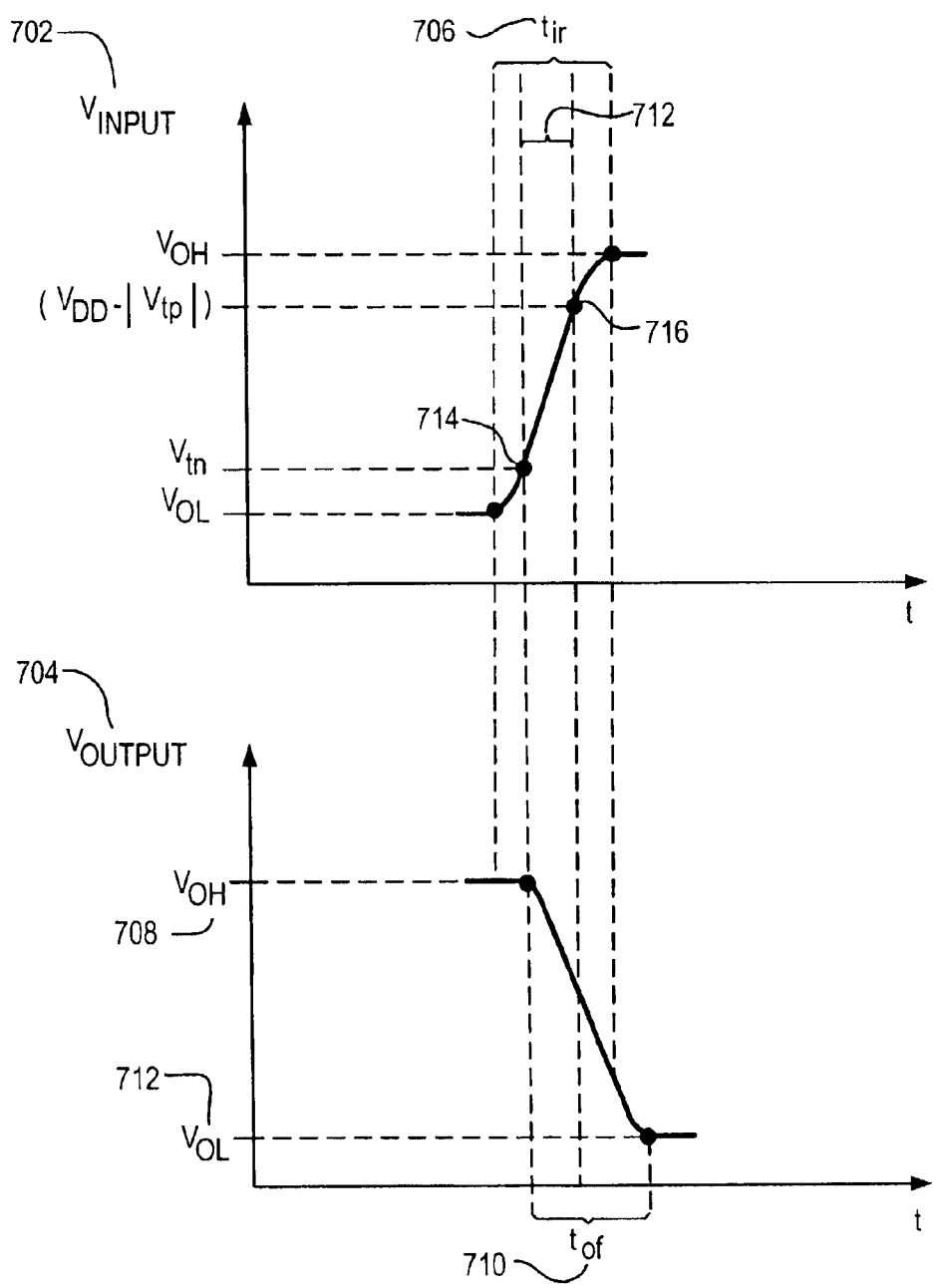
FIG. 7 is a graph of input signal voltage and output signal voltage versus time for a modified CMOS inverter for an output signal voltage transition from a digital "1" to a digital "0" according to the invention.

Referring to both FIGS. 6 and 7, FIG. 7 shows an exemplary input signal voltage 702 and an exemplary output signal voltage 704 versus time for an output signal voltage transition from a digital "1" to a digital "0" at output node 616 of modified CMOS inverter 600. Input signal voltage 702 transitions from a digital "0" to a digital "1" during input signal rise time 706. Because the output signal voltage 704 is initially $V_{OH}$ 708, switch 626 opens and switch 628 closes for the output signal transition from a digital "1" to a digital "0" at output node 616, thus causing output signal voltage 704 to transition digital states during reduced output signal fall time 710 (i.e., reduced in comparison to output signal fall time 416 (FIG. 4) of known CMOS inverter 100 (FIG. 1)). In particular, because drive current that supplements the drive current of transistor M2 608 flows from output node 616 to ground 624 via switch 628 during the output signal transition, the total effective output load capacitance is more quickly discharged to voltage $V_{OL}$ 712, thus reducing propagation delay and output signal fall time 710.

Figure 8:
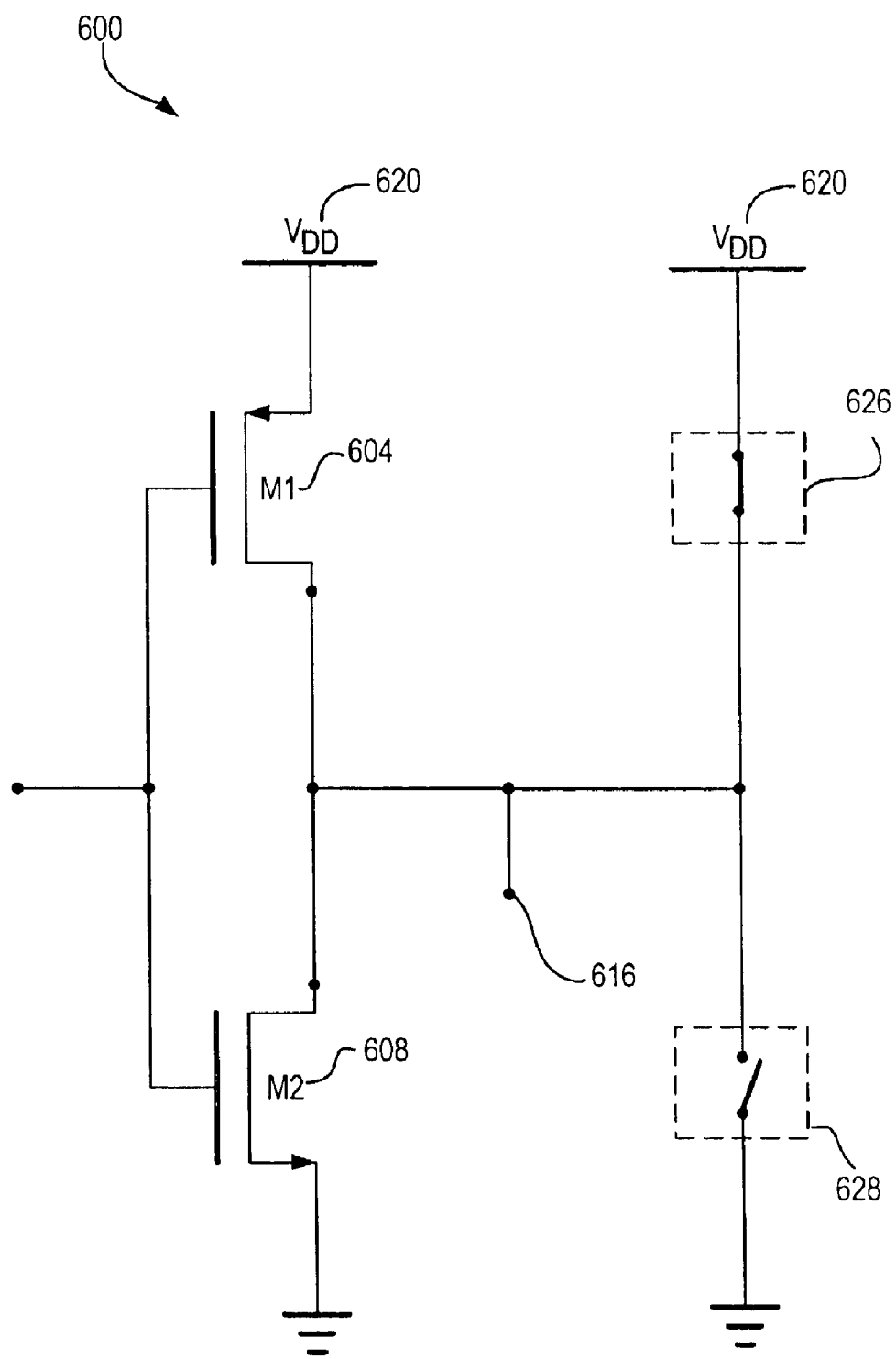
FIG. 8 is a circuit diagram of a modified CMOS inverter showing circuit configuration for an output signal voltage transition from a digital "0" to a digital "1" according to the invention.

FIG. 8 shows operation of switches 626 and 628 of modified CMOS inverter 600 for an output signal voltage transition from a digital "0" to a digital "1" at output node 616. As shown, switch 628 is open and switch 626 is closed. Switch 628 can be ideally modeled as an open-circuit and switch 626 can be ideally modeled as a finite resistance in the circuit configuration of FIG. 8.

Figure 9:
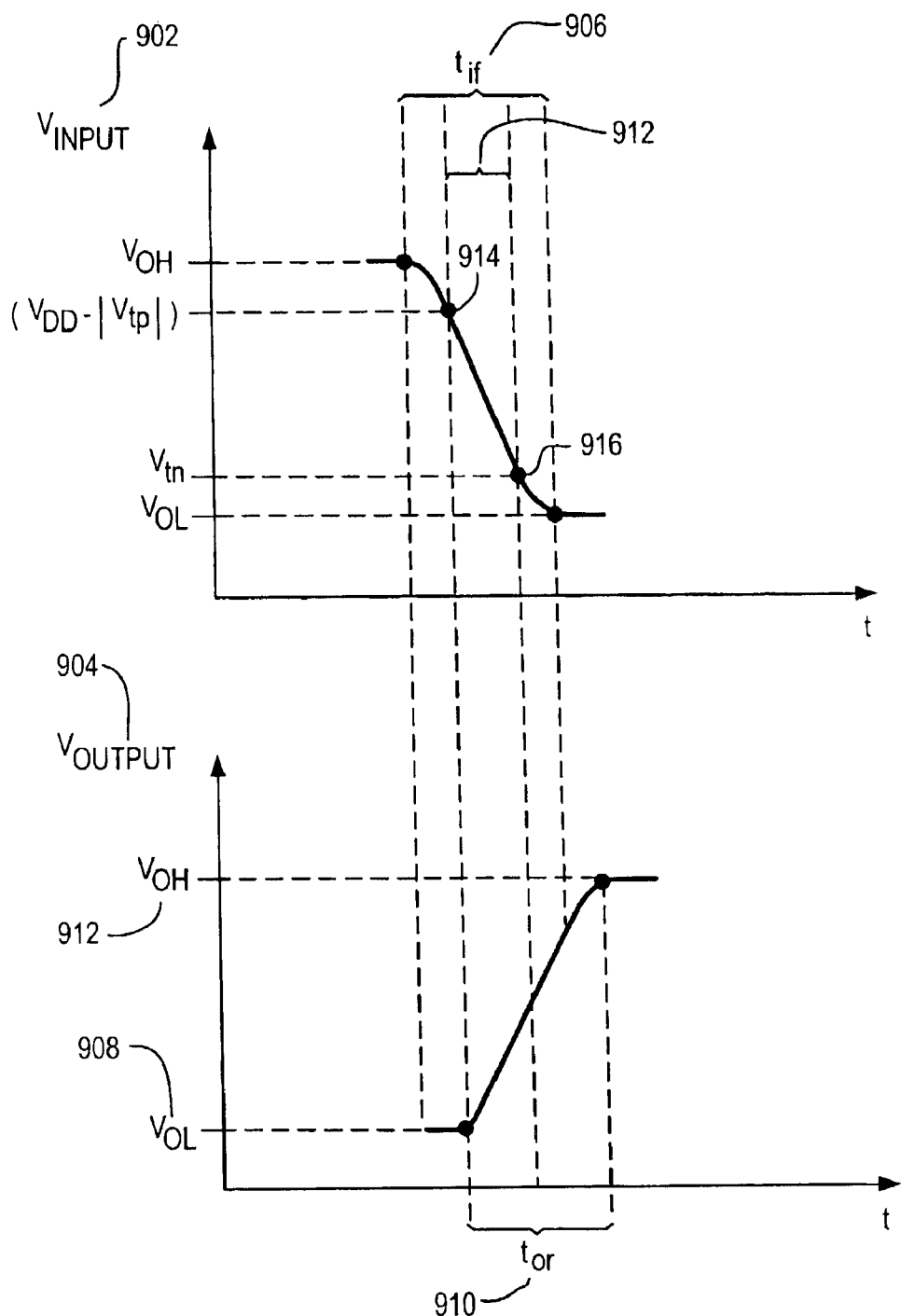
FIG. 9 is a graph of input signal voltage and output signal voltage versus time for a modified CMOS inverter for an output signal voltage transition from a digital "0" to a digital "1" according to the invention.

Referring to both FIGS. 8 and 9, FIG. 9 shows an exemplary input signal voltage 902 and an exemplary output signal voltage 904 versus time for an output transition from a digital "0" to a digital "1" at output node 616 of modified CMOS inverter 600. Input signal voltage 902 transitions from a digital "1" to a digital "0" during input signal fall time ($t_{if}$) 906. Because the output signal voltage is initially voltage $V_{OL}$ 908, switch 628 opens and switch 626 closes for the output signal voltage transition from a digital "0" to a digital "1" at output node 616, thus causing output signal voltage 904 to transition digital states during reduced output signal rise time ($t_{or}$) 910 (i.e., reduces in comparison to output signal rise time 428 (FIG. 4) of known CMOS inverter 100 (FIG. 1)). In particular, because drive current that supplements the drive current of transistor M1 604 flows from supply voltage $V_{DD}$ 620 to output node 616 via switch 626 during the output signal transition, the total effective output load capacitance is more quickly charged to voltage $V_{OH}$ 912, thus reducing propagation delay and output signal rise time 910.

Figure 10:
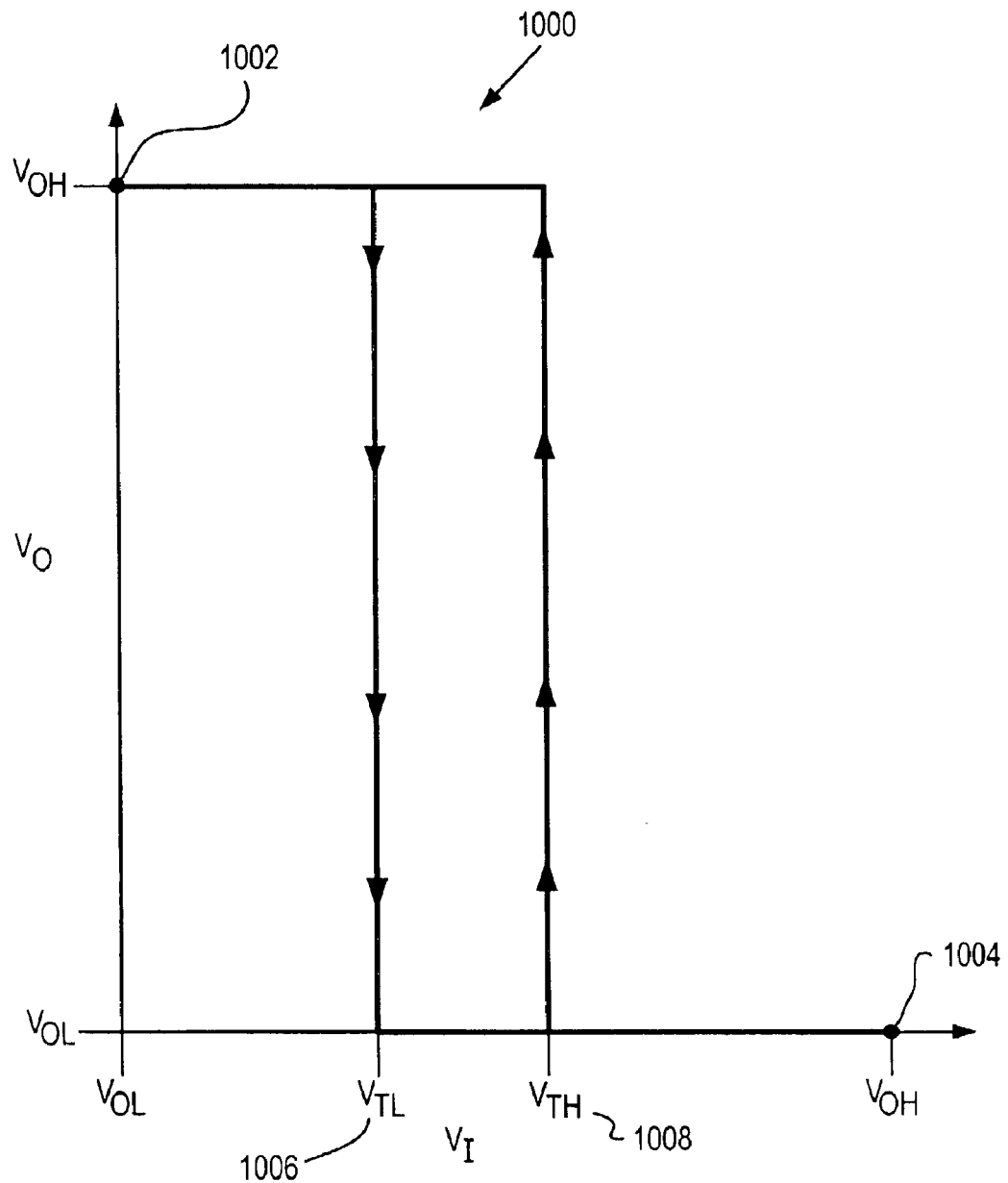
FIG. 10 is a graph of an ideal input/output signal voltage transfer characteristic of a modified CMOS inverter according to the invention.

Referring to both FIGS. 6 and 10, FIG. 10 shows an ideal input/output signal voltage transfer characteristic 1000 of modified CMOS inverter 600. As shown, during steady-state circuit operation, transfer characteristic 1000 of modified CMOS inverter 600 is similar to transfer characteristic 500 (FIG. 5) of known CMOS inverter 100 (FIG. 1). In particular, as shown by point 1002, an input signal voltage of $V_{OL}$ (i.e., a digital "0") results in an output signal voltage ($V_O$) of $V_{OH}$ (i.e., a digital "1") during steady-state circuit operation. Further, as shown by point 1004, an input signal voltage of $V_{OH}$ results in an output signal voltage of $V_{OL}$ during steady-state circuit operation. However, because switches 626 and 628 provide supplemental drive current during output signal digital state transitions of modified CMOS inverter 600 which effectively upsets the proportionality of transistors M1 604 and M2 608 (i.e., symmetry if transistors M1 and M2 are matched), the output signal voltage of modified CMOS inverter 600 transitions digital states sooner than known CMOS inverter 100 (FIG. 1). In particular, because switch 628 provides supplemental drive current during an output signal voltage transition from a digital "1" to a digital "0" which causes an increase in the effective $W_n$ and $u_n$ of transistor M2 608, the voltage transfer characteristic of transistors M1 604 and M2 608 shifts to the left, thus causing the output signal voltage of modified CMOS inverter 600 to transition from a digital "1" to a digital "0" once the input signal voltage exceeds low trip voltage ($V_{TL}$) 1006 (which is less than trip voltage 506 (FIG. 5) of known CMOS inverter 100 (FIG. 1), assuming that transistors M1 104 (FIG. 1) and M1 608 are equal, and that transistors M2 108 (FIG. 1) and M2 608 are equal). Consequently, modified CMOS inverter 600 exhibits an advantageously faster output signal fall time 710 (FIG. 7) than output signal fall time 416 (FIG. 4) of known CMOS inverter 100. Further, because switch 626 provides supplemental drive current during an output signal voltage transition from a digital "0" to a digital "1" which causes an increase in the effective $W_p$ and $u_p$ of transistor M1 604, the voltage transfer characteristic of transistors M1 604 and M2 608 shifts to the right, thus causing the output signal voltage of modified CMOS inverter 600 to transition from a digital "0" to a digital "1" once the input signal voltage falls below high trip voltage ($V_{TH}$) 1008 (which is greater than trip voltage 506 (FIG. 5) of known CMOS inverter 100 (FIG. 1), assuming that transistors M1 104 (FIG. 1) and M1 608 are equal, and that transistors M2 108 (FIG. 1) and M2 608 are equal). Consequently, modified CMOS inverter exhibits an advantageously faster output signal rise time 910 (FIG. 9) than output signal rise time 428 (FIG. 4) of known CMOS inverter 100.

Because transistors M1 604 and M2 608 of modified CMOS inverter 600 maintain the output voltage at output node 616 during steady-state circuit operation (i.e., transistors M1 604 and M2 608 prevent drifting of the nodal voltage at output node 616 after transient currents have settled and while switches 626 and 628 are open), modified CMOS inverter 600 is suited for static applications (e.g., static memory applications). Note, however, modified CMOS inverter 600 can also be used for dynamic applications (e.g., dynamic memory applications).

Figure 11:
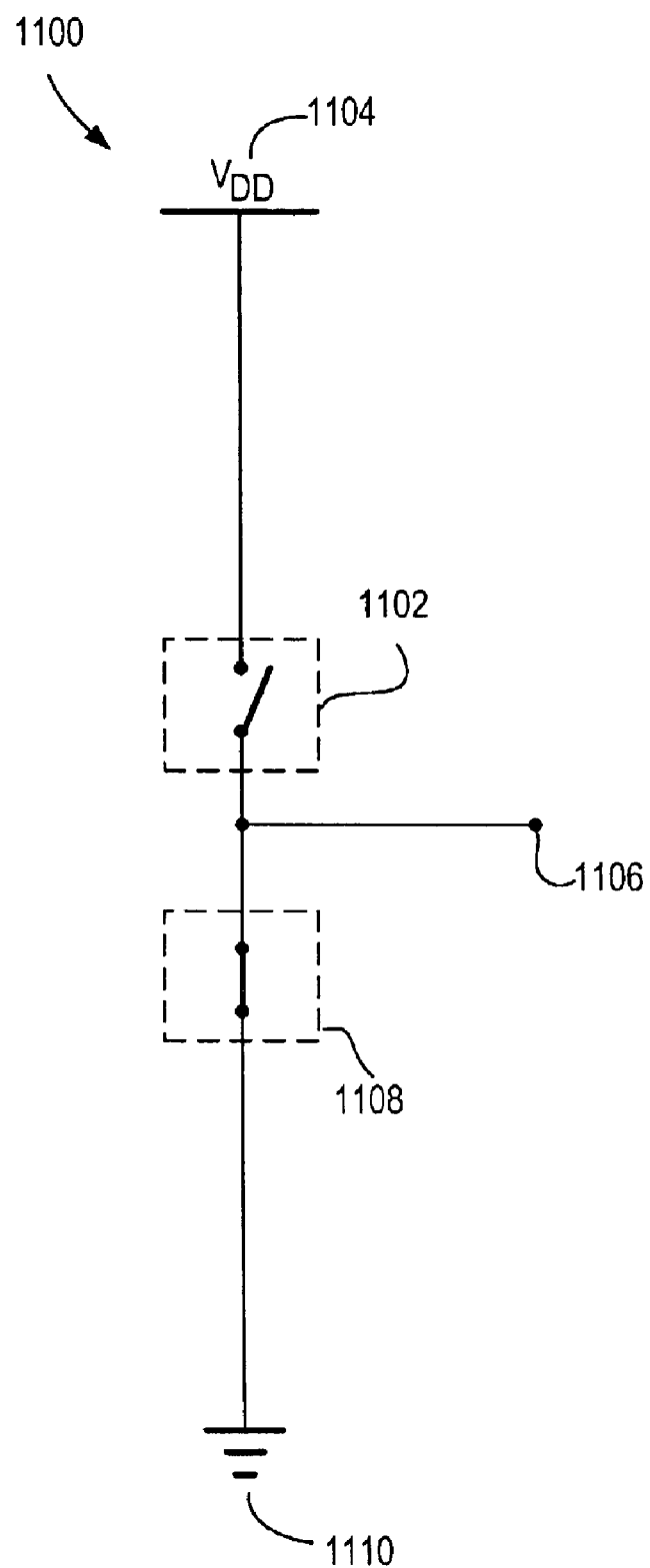
FIG. 11 is a circuit diagram of a circuit suited for dynamic applications showing circuit configuration for an output signal voltage transition from a digital "1" to a digital "0" according to the invention.

In some embodiments in accordance with the invention, circuits suited primarily for dynamic applications may be provided. FIG. 11 shows a circuit 1100 suited primarily for dynamic applications. As shown, circuit 1100 is similar to modified CMOS inverter 600. In particular, switch 1102 makes a series connection between supply voltage $V_{DD}$ 1104 and output node 1106 and switch 1108 makes a series connection between ground 1110 and output node 1106. However, circuit 1100 does not include transistors for maintaining nodal voltages at output node 1106 during steady-state circuit operation (e.g., transistors M1 604 and M2 608 (FIG. 5)). Thus, circuit 1100 may not be suited for static applications.

Operation of switches 1102 and 1108 of circuit 1100 is similar to operation of switches 626 and 628 of modified CMOS inverter 600 (FIG. 6). In particular, both an input signal voltage (not shown) and the output signal voltage at output node 1106 determine operation of switches 1102 and 1108 (i.e., whether they are open or closed) via a feedback path (not shown). Feedback circuits and methods are described in detail in subsequent sections of this disclosure. For an output signal voltage transition from a digital "1" to a digital "0" at output node 1106 (i.e., responsive to an input signal voltage transition from a digital "0" to a digital "1"), switch 1102 is open and switch 1108 is closed (i.e., as shown in FIG. 11). Input and output voltage waveforms for an output signal voltage transition from a digital "1" to a digital "0" of circuit 1100 appear similar to those of FIG. 7. In particular, the circuit configuration of FIG. 11 provides reduced propagation delay (i.e., in comparison to known CMOS inverter 100 (FIG. 1)) for an output signal voltage transition from a digital "1" to a digital "0", thus reducing output signal fall time.

Figure 12:
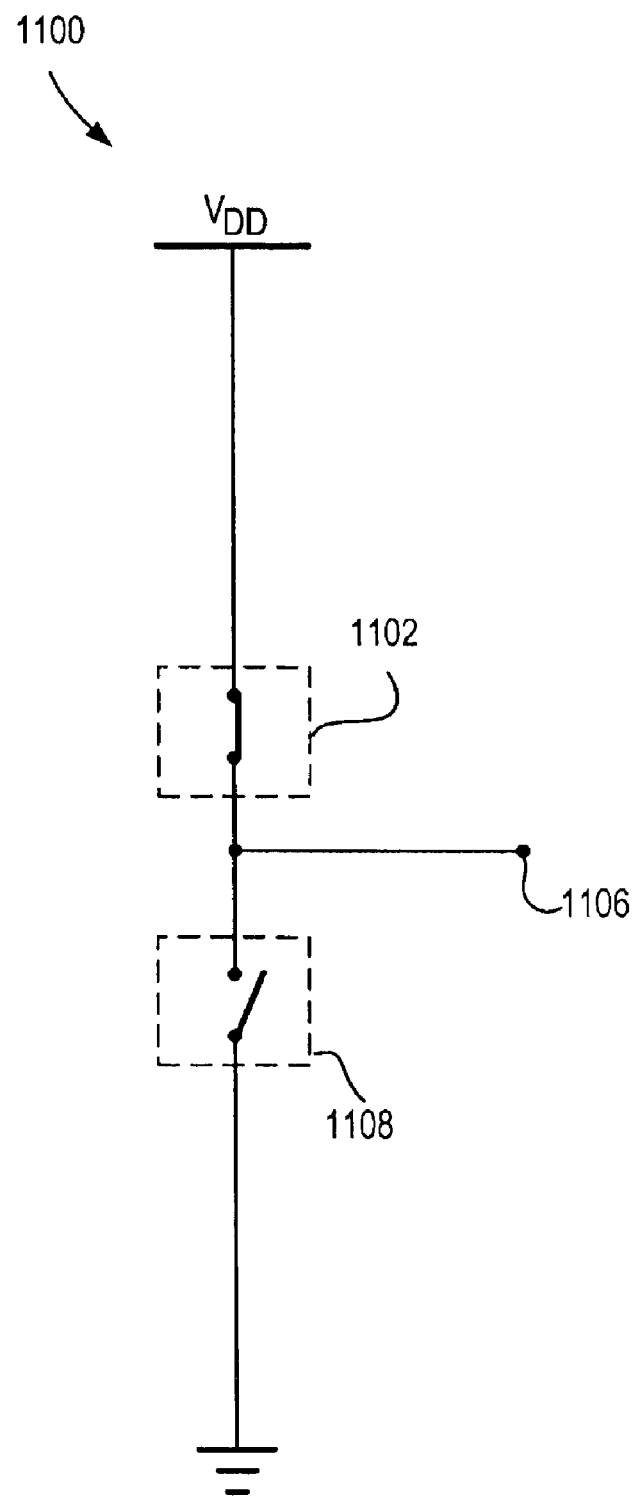
FIG. 12 is a circuit diagram of a circuit suited for dynamic applications showing circuit configuration for an output signal voltage transition from a digital "0" to a digital "1" according to the invention.

Referring to FIG. 12, for an output signal voltage transition from a digital "0" to a digital "1" at output node 1106 (i.e., responsive to an input signal voltage transition from a digital "1" to a digital "1"), switch 1108 is open and switch 1102 is closed. Input and output voltage waveforms for an output signal voltage transition from a digital "0" to a digital "1" of circuit 1100 appear similar to those of FIG. 9. In particular, the circuit configuration of FIG. 12 provides reduced propagation delay (i.e., in comparison to known CMOS inverter 100 (FIG. 1)) for an output signal voltage transition from a digital "0" to a digital "1", thus reducing output signal rise time.

Operation of circuit 1100 is not, however, identical to operation of modified CMOS inverter 600 (FIG. 6). In particular, because circuit 1100 does not include transistors for maintaining nodal voltages at output node 1106 during steady-state circuit operation (e.g., as does modified CMOS inverter 600), switches 1102 and 1108 are required to dynamically (i.e., continuously) open and close (i.e., responsive to a dynamically transitioning input signal voltage) to prevent drifting of the output voltage (i.e., drifting due to leakage current) at output node 1106.

Figure 13:
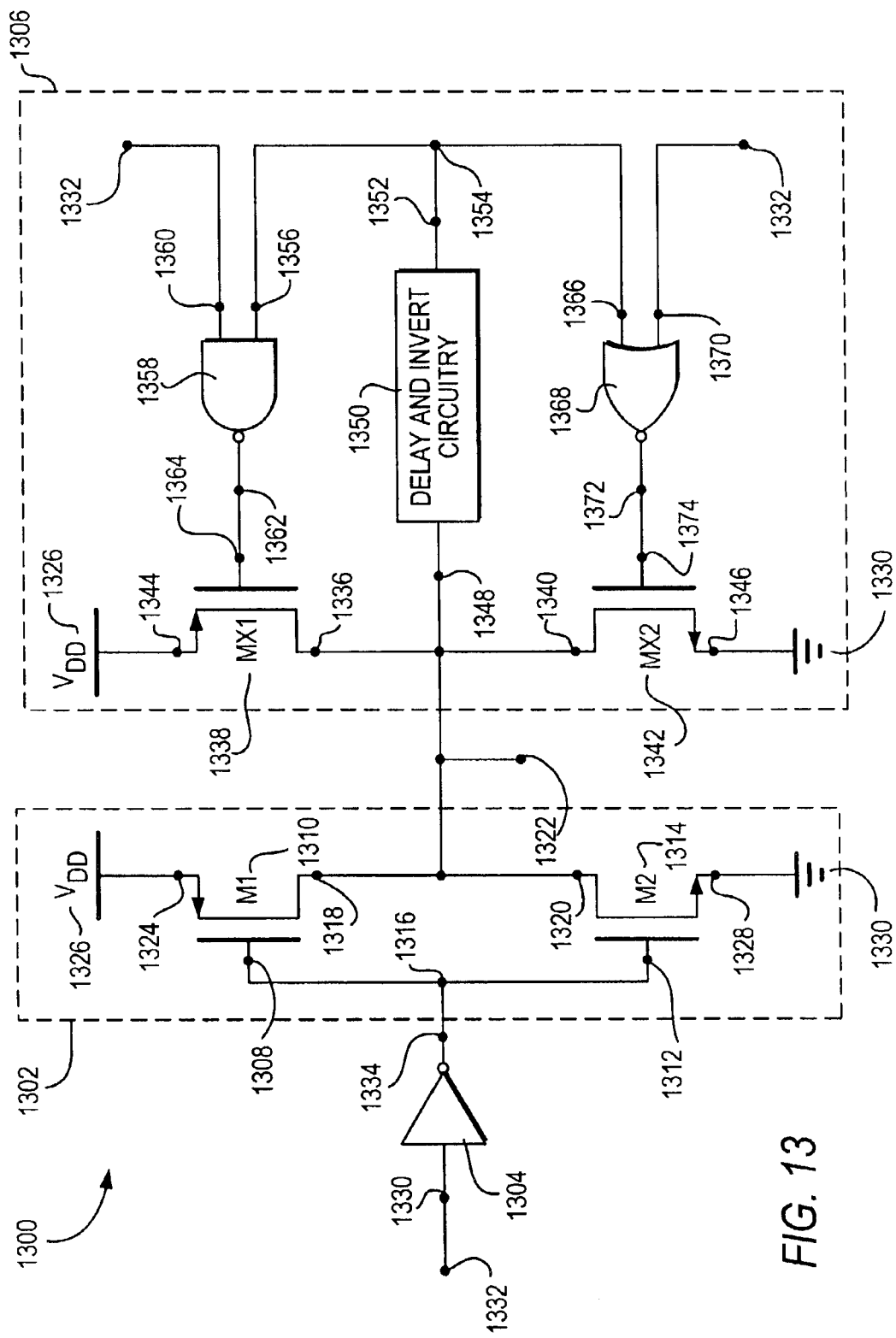
FIG. 13 is a circuit diagram of a modified non-inverting two-stage CMOS circuit according to the invention.

Referring to both FIGS. 6 and 13, FIG. 13 shows one embodiment of modified CMOS inverter 600 in accordance with the invention. In particular, FIG. 13 shows a modified non-inverting two-stage CMOS circuit 1300. As shown, section 1302 of circuit 1300 is similar to section 630 of modified CMOS inverter 600. Gate terminal 1308 of p-type transistor M1 1310 and gate terminal 1312 of n-type transistor M2 1314 are connected at node 1316. Drain terminal 1318 of transistor M1 1310 and drain terminal 1320 of transistor M2 1314 are connected at output node 1322. Source terminal 1324 of transistor M1 1310 is connected to supply voltage $V_{DD}$ 1326. Source terminal 1328 of transistor M2 1314 is connected to ground 1330.

Input terminal 1330 of logic inverter 1304 is connected to input node 1332 and output terminal 1334 of logic inverter 1304 is connected to node 1316. The input voltage signal of circuit 1300 is applied to input node 1332.

Section 1306 of modified circuit 1300 shows one embodiment of section 632 of modified CMOS inverter 600. Section 1306 of circuit 1300 operates to increase drive strength and reduce propagation delay of the circuitry of section 1302 (i.e., a CMOS inverter) through the use of feedback. Drain 1336 of p-type supplemental drive transistor MX1 1338 and drain 1340 of n-type supplemental drive transistor MX2 1342 are connected to output node 1322. Source terminal 1344 of supplemental drive transistor MX1 1338 is connected to supply voltage $V_{DD}$ 1326. Source terminal 1346 of supplemental drive transistor MX2 1342 is connected to ground 1330. Input terminal 1348 of delay and invert circuitry 1350 is connected to output node 1322 and output terminal 1352 of delay and invert circuitry 1350 is connected to node 1354. Input terminal 1356 of NAND gate 1358 is connected to node 1354. Input terminal 1360 of NAND gate 1358 is connected to input node 1332. Output terminal 1362 of NAND gate 1358 is connected to gate terminal 1364 of supplemental drive transistor MX1 1338. Input terminal 1366 of NOR gate 1368 is connected to node 1354. Input terminal 1370 of NOR gate 1368 is connected to input node 1332. Output terminal 1372 of NOR gate 1368 is connected to gate terminal 1374 of supplemental drive transistor MX2 1342.

Delay and invert circuitry 1350 provides a feedback path from output node 1322 to node 1354. During steady-state circuit operation, delay and invert circuitry 1350 outputs to node 1354 a delayed and digitally inverted version of the output signal voltage of output node 1322. Delay and invert circuitry 1350 can be, for example, a plurality of series-connected logic inverters (e.g., three logic inverters each similar to logic inverter 1304) that outputs to node 1354 a delayed and digitally inverted version of the output signal voltage at output node 1322. Therefore, because the output signal voltage at output node 1322 is digitally in-phase with the input signal voltage at input node 1332 during steady-state circuit operation (i.e., the output signal voltage is a digital "1" when the input signal voltage is a digital "1" and the output signal voltage is a digital "0" when the input signal voltage is a digital "0"), the signal voltage at node 1354 is the digital invert of the input signal voltage at input node 1332 during steady-state circuit operation.

During output signal voltage transitions at output node 1322, delay and invert circuitry 1350 outputs to node 1354 a signal voltage that is digitally in-phase with the signal voltage at input node 1332. In particular, during an output signal voltage transition from a digital "0" to a digital "1" at output node 1322 (which is responsive to an input signal voltage transition from a digital "0" to a digital "1" at input node 1332), delay and invert circuitry 1350 outputs to node 1354 a digital "1". Alternatively, during an output signal voltage transition from a digital "1" to digital "0" at output node 1322 (which is responsive to an input signal voltage transition from a digital "1" to digital "0" at input node 1332), delay and invert circuitry 1150 outputs to node 1354 a digital "0". Delay and invert circuitry 1350 preferably outputs to node 1354 a signal voltage that is digitally in-phase with the signal voltage at input node 1332 until a time slightly before an output signal voltage transition at output node 1322 is complete. This time is preferably equal to about the time required for a signal at node 1354 to propagate through to turn "OFF" supplemental drive transistor MX1 1338 (for an output signal voltage transition from a digital "0" to a digital "1") or supplemental drive transistor MX2 1342 (for an output signal voltage transition from a digital "1" to a digital "0").

Figure 14:
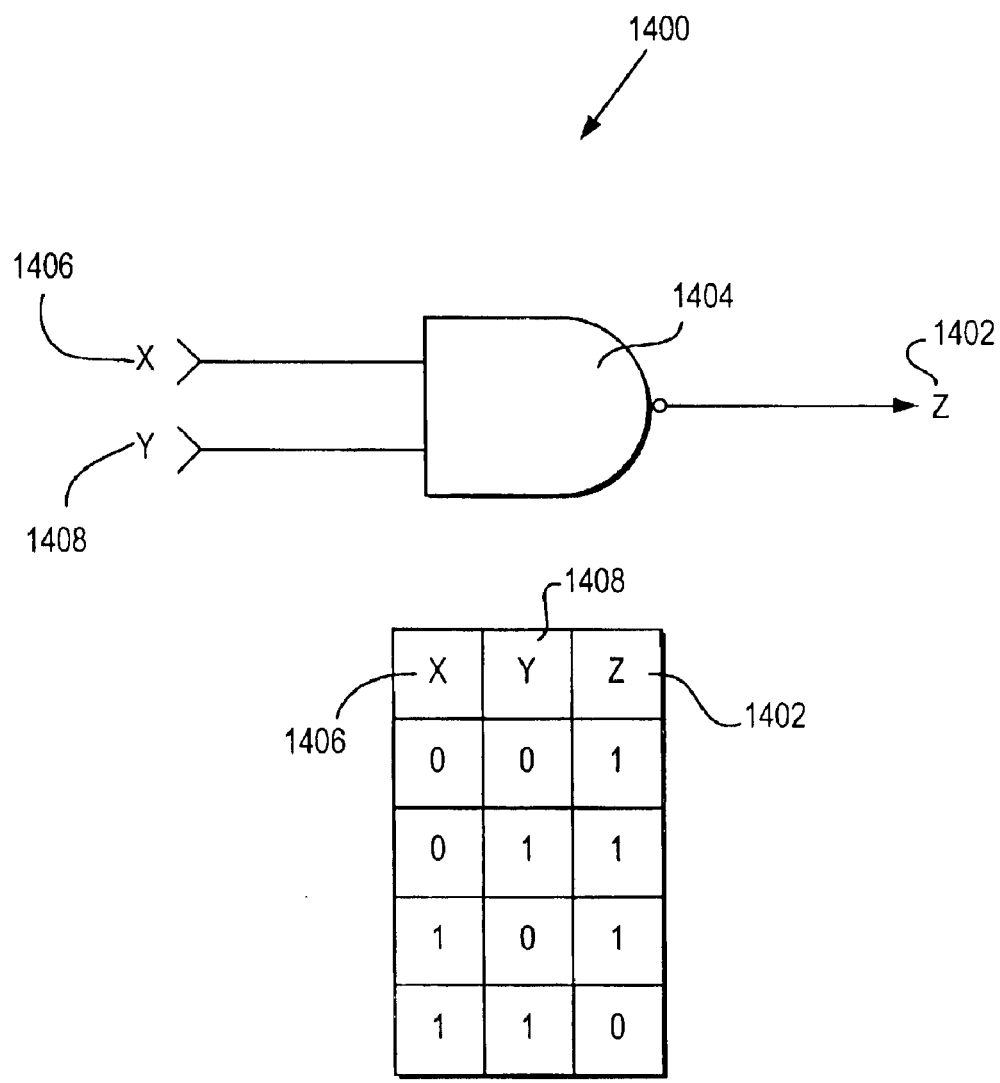
FIG. 14 is a truth table for a digital logic NAND gate.

NAND gate 1358 determines operation of supplemental drive transistor MX1 1338. In particular, a NAND gate output 1362 (which is responsive to NAND gate inputs 1360 and 1356) of digital "1" turns "OFF" transistor MX1 1338 and a NAND gate output 1362 of digital "0" turns "ON" supplemental drive transistor MX1 1338. FIG. 14 shows a truth table 1400 for NAND gate operation. As shown, output Z 1402 of NAND gate 1404 is a digital "0" when both NAND gate inputs X 1406 and Y 1408 are digital "1". For all other combinations of NAND gate inputs X 1406 and Y 1408, NAND gate output Z 1402 is a digital "1".

Because the input signal voltage at input node 1332 (i.e., the input signal at NAND gate input terminal 1360) and the signal voltage at node 1354 (i.e., the input signal at NAND gate input terminal 1356) are always digital inverts during steady-state circuit operation, NAND gate 1358 maintains supplemental drive transistor MX1 1338 "OFF" (i.e., NAND gate 1358 outputs a digital "1") during steady-state circuit operation. Similarly, because both input signal voltage at input node 1332 and signal voltage at node 1354 are digital "0" for an output signal voltage transition from digital "1" to digital "0" at output node 1322, NAND gate 1358 maintains supplemental drive transistor MX1 1338 "OFF" during an output signal voltage transition from digital "1" to digital "0".

Because both input signal voltage at input node 1332 and signal voltage at node 1354 are digital "1" for an output signal voltage transition from digital "0" to digital "1" at output node 1122, NAND gate 1358 turns "ON" supplemental drive transistor MX1 1338 (i.e., NAND gate 1358 outputs a digital "0") during an output signal voltage transition from digital "0" to digital "1". "ON" supplemental drive transistor MX1 1338 sources drive current that supplements the relatively insignificant drive current sourced by "ON" transistor M1 1310 (i.e., insignificant as a result of crowbar current of simultaneously conducting transistors M1 1310 and M2 1314). The increased drive current more quickly charges (i.e., in comparison to a known non-inverting two-stage CMOS circuit using, for example, a cascade of two CMOS inverters 100 (FIG. 1)) the total effective output load capacitance seen at output node 1322, thus reducing propagation delay and output signal rise time. Responsive to a digital state transition of the signal output from delay and invert circuitry 1350 to input terminal 1356 of NAND gate 1358, NAND gate 1358 turns "OFF" supplemental drive transistor MX1 1338 once the output signal voltage at output node 1322 reaches its steady-state digital "1" value (i.e., $V_{OH}$). "ON" transistor M1 1310 maintains the output voltage at output node 1322 at $V_{OH}$ during steady-state circuit operation. Note that in embodiments in which input signal voltage 1332 dynamically transitions (e.g., as in circuit 1100 (FIGS. 11 and 12)), transistor M1 1310 may be an optional component of circuit 1300 (i.e., transistor M1 1310 may not be needed to prevent drifting of the nodal voltage at output node 1322).

Figure 15:
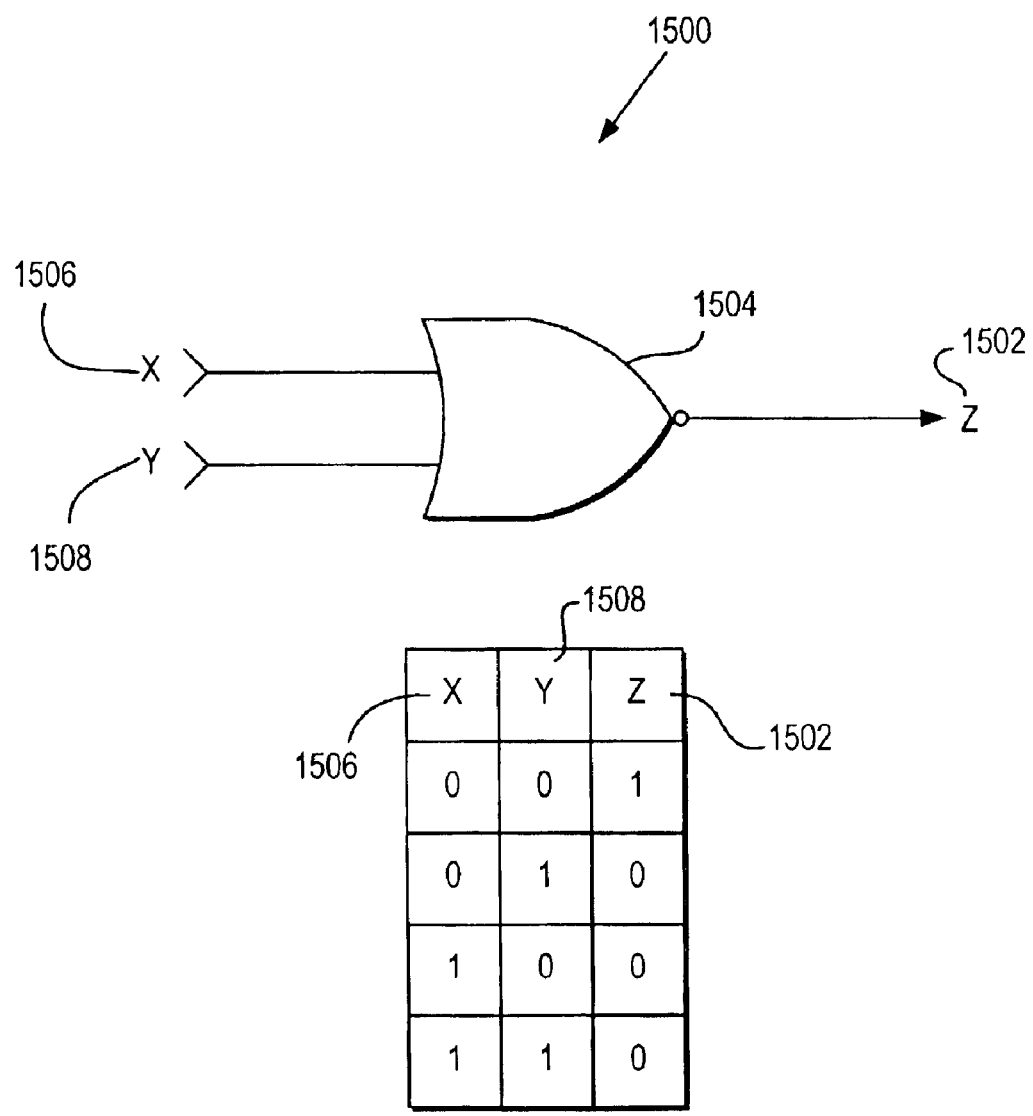
FIG. 15 is a truth table for a digital logic NOR gate.

NOR gate 1368 determines operation of transistor MX2 1342. In particular, a NOR gate output 1372 (which is responsive to NOR gate inputs 1366 and 1370) of digital "0" turns "OFF" supplemental drive transistor MX2 1342 and a NOR gate output 1372 of digital "1" turns "ON" supplemental drive transistor MX2 1342. FIG. 15 shows a truth table 1500 for NOR gate operation. As shown, output Z 1502 of NOR gate 1504 is a digital "1" when both NOR gate inputs X 1506 and Y 1508 are digital "0". For all other combinations of NOR gate inputs X 1506 and Y 1508, NOR gate output Z 1502 is a digital "0".

Because the input signal voltage at input node 1332 (i.e., the input signal at NOR gate input terminal 1370) and the signal voltage at node 1354 (i.e., the input signal at NOR gate input terminal 1356) are always digital inverts during steady-state circuit operation, NOR gate 1368 maintains supplemental drive transistor MX2 1342 "OFF" (i.e., NOR gate 1368 outputs a digital "0") during steady-state circuit operation. Similarly, because both input signal voltage at input node 1332 and signal voltage at node 1354 are digital "1" for an output signal voltage transition from digital "0" to digital "1" at output node 1322, NOR gate 1168 maintains supplemental drive transistor MX2 1342 "OFF" during an output signal voltage transition from digital "0" to digital "1".

Because both input signal voltage at input node 1332 and signal voltage at node 1354 are digital "0" for an output signal voltage transition from digital "1" to digital "0", NOR gate 1368 turns "ON" supplemental drive transistor MX1 1342 (i.e., NOR gate 1368 outputs a digital "1") during an output signal voltage transition from digital "1" to digital "0" at output node 1322. "ON" supplemental drive transistor MX2 1342 sources drive current that supplements the relatively insignificant drive current sourced by "ON" transistor M2 1314 (i.e, insignificant as a result of crowbar current of simultaneously conducting transistors M1 1310 and M2 1314). The increased drive current more quickly discharges (i.e., in comparison to a known non-inverting two-stage CMOS circuit using, for example, a cascade of two CMOS inverters 100 (FIG. 1)) the total effective output load capacitance seen at output node 1322, thus reducing propagation delay and output signal fall time. Responsive to a digital state transition of the signal output by delay and invert circuitry 1350 to input terminal 1368 of NOR gate 1168, NOR gate 1168 turns "OFF" supplemental drive transistor MX2 1342 once the output signal voltage at output node 1322 reaches its steady-state digital "0" value (i.e., $V_{OL}$). "ON" transistor M2 1314 maintains the output voltage at output node 1314 at $V_{OL}$ during steady-state circuit operation. Note that in embodiments in which input signal voltage 1332 dynamically transitions, transistor M2 1314 may be an optional component in circuit 1300 (i.e., transistor M2 1314 may not be needed to prevent drifting of the nodal voltage at output node 1322).

Circuit 1300 of FIG. 13 is only exemplary. In some embodiments, supplemental drive current may be provided during an output signal transition from a digital "1" to a digital "0", but not during an output signal transition from a digital "0" to a digital "1". For example, NAND gate 1358 and transistor MX1 1338 can be removed from circuit 1300 to reduce propagation delay for an output signal transition from a digital "1" to a digital "0" only. Alternatively, in some embodiments, supplemental drive current may be provided during an output signal transition from a digital "0" to a digital "1", but not during an output signal transition from a digital "1" to a digital "0". For example, NOR gate 1368 and transistor MX2 1342 can be removed from circuit 1300 to reduce propagation delay for an output signal transition from a digital "0" to digital "1" only.

Further, logic circuitry other than the logic circuitry of circuit 1300 can be used in circuitry operative to increase drive strength and reduce propagation delay of a digital logic circuit through the use of feedback. For example, other digital logic gates such as AND and OR gates can be used in feedback circuitry operative to control supplemental drive transistors. Similarly, depending on circuit configuration, like digital logic gates may be used for different purposes. For example, in some embodiments, a digital logic NAND gate can be used turn "ON" a supplemental drive transistor during an output signal digital state transition from a digital "1" to a digital "0". As another example, in some embodiments, a digital logic NOR gate can be used to turn "ON" a supplemental drive transistor during an output signal digital state transition from a digital "0" to a digital "1".

Thus it is seen that circuits and methods for increasing drive strength and reducing propagation delays of a digital logic circuit are provided. One skilled in the art will appreciate that the present invention can be practiced by other than the described embodiments, which are presented for the purposes of illustration and not of limitation, and the present invention is limited only by the claims which follow.

I claim:

1. Circuitry for increasing drive strength of a digital logic circuit through the use of feedback, comprising:

delay circuitry operative to receive and delay an output signal from an output terminal of said digital logic circuit;

at least one drive transistor operative to source supplemental drive current to said digital logic circuit; and logic circuitry having a first input terminal connected to an input terminal of said digital logic circuit, a second input terminal connected to an output terminal of said delay circuitry, and at least one output terminal operative to turn "ON" said at least one drive transistor for an output signal digital state transition at said output terminal of said digital logic circuit and turn "OFF"

said at least one drive transistor once said output signal digital state transition is complete.

2. The circuitry of claim 1 wherein said delay circuitry comprises at least one logic inverter.

3. The circuitry of claim 1 wherein said delay circuitry comprises delay circuitry operative to receive, delay, and digitally invert said output signal from said output terminal of said digital logic circuit.

4. The circuitry of claim 1 wherein a signal at said output terminal of said delay circuitry changes digital states at a time before said output signal digital state transition is complete whereby said logic circuitry turns "OFF" said at least one drive transistor once said output signal digital state transition is complete.

5. The circuitry of claim 4 wherein said time is equal to about a time required for an output signal at said at least one output terminal of said logic circuitry to transition digital states responsive to an input signal digital state transition at said second input terminal of said logic circuitry.

6. The circuitry of claim 1 wherein said at least one drive transistor comprises at least one drive transistor operative to source supplemental drive current to said digital logic circuit during an output signal transition from a digital "1" to a digital "0" at said output terminal of said digital logic circuit.

7. The circuitry of claim 1 wherein said at least one drive transistor comprises at least one drive transistor operative to source supplemental drive current to said digital logic circuit during an output signal transition from a digital "0" to a digital "1" at said output terminal of said digital logic circuit.

8. The circuitry of claim 1 wherein said supplemental drive current reduces propagation delay of said digital logic circuit.

9. The circuitry of claim 1 wherein said supplemental drive current increases fan-out capability of said digital logic circuit.

10. The circuitry of claim 1 wherein said logic circuitry is operative to turn "ON" said at least one drive transistor responsive to an input signal digital state transition at said first input terminal of said logic circuitry.

11. The circuitry of claim 1 wherein said logic circuitry is operative to turn "OFF" said at least one drive transistor responsive to an input signal digital state transition at said second input terminal of said logic circuitry.

12. The circuitry of claim 1 wherein said logic circuitry comprises a digital logic NAND gate.

13. The circuitry of claim 12 wherein said digital logic NAND gate is operative to turn "ON" said at least one drive transistor for said output signal digital state transition at said output terminal of said digital logic circuit and turn "OFF" said at least one drive transistor when said output signal digital state transition is complete.

14. The circuitry of claim 13 wherein said output signal digital state transition comprises an output signal transition from a digital "0" to a digital "1" at said output terminal of said digital logic circuit.

15. The circuitry of claim 13 wherein said output signal digital state transition comprises an output signal transition from a digital "1" to a digital "0" at said output terminal of said digital logic circuit.

16. The circuitry of claim 1 wherein said logic circuitry comprises a digital logic NOR gate.

17. The circuitry of claim 16 wherein said digital logic NOR gate is operative to turn "ON" said at least one drive transistor for said output signal digital state transition at said output terminal of said digital logic circuit and turn "OFF" said at least one drive transistor once said output signal digital state transition is complete.

18. The circuitry of claim 17 wherein said output signal digital state transition comprises an output signal transition from a digital "1" to a digital "0" at said output terminal of said digital logic circuit.

19. The circuitry of claim 17 wherein said output signal digital state transition comprises an output signal transition from a digital "0" to a digital "1" at said output terminal of said digital logic circuit.

20. The circuitry of claim 1 wherein a signal at said output terminal of said delay circuitry changes digital states at a time before said digital state transition completes at said output terminal of said digital logic circuit, said time being equal to about a time required for said signal at said output terminal of said delay circuitry to propagate through said logic circuitry to turn "OFF" said at least one drive transistor.

21. The circuitry of claim 1 wherein said delay circuitry comprises a plurality of logic inverters connected in series.

22. A non-inverting two-stage CMOS circuit, said circuit comprising:

a logic inverter having an input terminal and an output terminal wherein said input terminal is an input terminal of said non-inverting two-stage CMOS circuit;

a CMOS inverter having an input terminal and an output terminal wherein said input terminal of said CMOS inverter is connected to said output terminal of said logic inverter and wherein said output terminal of said CMOS inverter is an output terminal of said non-inverting two-stage CMOS circuit;

at least one drive transistor operative to provide supplemental drive current to said CMOS inverter;

delay and invert circuitry operative to receive, delay, and digitally invert a signal from said output terminal of said non-inverting two-stage CMOS circuit;

logic circuitry having a first input terminal connected to said input terminal of said non-inverting two stage CMOS circuit, a second input terminal connected to an output terminal of said delay and invert circuitry, and at least one output terminal operative to turn "ON" said at least one drive transistor for an output digital state transition at said output terminal of said non-inverting two-stage CMOS circuit and turn "OFF" said at least one drive transistor once said output digital state transition is complete.

23. The circuit of claim 22 wherein said at least one drive transistor comprises at least one drive transistor operative to provide supplemental drive current to said CMOS inverter during an output digital state transition from a digital "1" to a digital "0" at said output terminal of said non-inverting two-stage CMOS circuit.

24. The circuit of claim 22 wherein said at least one drive transistor comprises at least one drive transistor operative to provide supplemental drive current to said CMOS inverter during an output digital state transition from a digital "0" to a digital "1" at said output terminal of said non-inverting two-stage CMOS circuit.

25. The circuit of claim 22 wherein said supplemental drive current reduces propagation delay of said CMOS inverter.

26. The circuit of claim 22 wherein said supplemental drive current increases fan-out capability of said CMOS inverter.

27. The circuit of claim 22 wherein said delay and invert circuitry is at least one logic inverter.

28. The circuit of claim 22 wherein a signal at said output terminal of said delay and invert circuitry changes digital states at a time before said output signal digital state transition is complete whereby said logic circuitry turns "OFF" said at least one drive transistor once said output signal digital state transition is complete.

29. The circuit of claim 28 wherein said time is equal to about a time required for a signal at said output terminal of said logic circuitry to transition digital states responsive to an input signal digital state transition at said second input terminal of said logic circuitry.

30. The circuit of claim 22 wherein said logic circuitry is operative to turn "ON" said at least one drive transistor responsive to an input signal digital state transition at said first input terminal of said logic circuitry.

31. The circuit of claim 22 wherein said logic circuitry is operative to turn "OFF" said at least one drive transistor responsive to an input signal digital state transition at said second input terminal of said logic circuitry.

32. The circuit of claim 22 wherein said logic circuitry comprises at least one digital logic NAND gate.

33. The circuit of claim 32 wherein said at least one digital logic NAND gate is operative to turn "ON" said at least one drive transistor for an output signal digital state transition from a digital "0" to a digital "1" at said output terminal of said non-inverting two-stage CMOS circuit and turn "OFF" said at least one drive transistor once said output signal digital state transition is complete.

34. The circuit of claim 22 wherein said logic circuitry comprises at least one digital logic NOR gate.

35. The circuit of claim 34 wherein said at least one digital logic NOR gate is operative to turn "ON" said at least one drive transistor for an output signal digital state transition from a digital "1" to a digital "0" at said output terminal of said non-inverting two-stage CMOS circuit and turn "OFF" said at least one drive transistor once said output signal digital state transition is complete.

36. The circuit of claim 22 wherein a signal at said output terminal of said delay and invert circuitry changes digital states at a time before said digital state transition completes at said output terminal of said non-inverting two-stage CMOS circuit, said time being equal to about a time required for said signal at said output terminal of said delay and invert circuitry to propagate through said logic circuitry to turn "OFF" said at least one drive transistor.

37. The circuit of claim 22 wherein said delay and invert circuitry comprises a plurality of logic inverters connected in series.

38. A method of increasing drive strength of a digital logic circuit through the use of feedback, the method comprising:
    determining that an input signal of said digital logic circuit has transitioned digital states;
    causing at least one drive transistor to provide supplemental drive current to said digital logic circuit during an output signal digital state transition of said digital logic circuit wherein said output signal transition is responsive to said input signal digital state transition;
    determining via a feedback path when said output signal digital state transition will complete; and
    outputting a signal that causes said at least one drive transistor to discontinue providing said supplemental drive current to said digital logic circuit at substantially the same time that said output signal digital state transition completes.

39. The method of claim 38 wherein said determining that an input signal of said digital logic circuit has transitioned digital states comprises receiving an input signal of said digital logic circuit during a digital state transition of said input signal.

40. The method of claim 38 wherein said causing at least one drive transistor to provide supplemental drive current comprises causing at least one drive transistor to provide supplemental drive current to said digital logic circuit during an output signal transition from a digital "1" to a digital "0" of said digital logic circuit.

41. The method of claim 38 wherein said causing at least one drive transistor to provide supplemental drive current comprises causing at least one drive transistor to provide supplemental drive current to said digital logic circuit during an output signal transition from a digital "0" to a digital "1" of said digital logic circuit.

42. The method of claim 38 wherein said causing at least one drive transistor to provide supplemental drive current comprises turning "ON" said at least one drive transistor.

43. The method of claim 38 wherein said causing at least one drive transistor to provide supplemental drive current comprises reducing propagation delay of said digital logic circuit.

44. The method of claim 38 wherein said causing at least one drive transistor to provide supplemental drive current comprises increasing fan-out capability of said digital logic circuit.

45. The method of claim 38 wherein said determining via a feedback path when said output signal digital state transition will complete comprises receiving a delayed version of an output signal of said digital logic circuit.

46. The method of claim 38 wherein said determining via a feedback path when said output signal digital state transition will complete comprises receiving a delayed and digitally inverted version of an output signal of said digital logic circuit.

47. The method of claim 33 wherein said outputting a signal that causes said at least one drive transistor to discontinue providing said supplemental drive current comprises outputting a signal that turns "OFF" said at least one drive transistor at substantially the same time that said output signal digital state transition completes.

48. The method of claim 38 wherein outputting a signal comprises outputting said signal at a time before said output signal digital state transition completes, said time being equal to about a time required for said signal to propagate through to turn "OFF" said at least one drive transistor.

49. The method of claim 38 wherein outputting a signal comprises outputting a signal by a plurality of logic inverters connected in series.

50. A method of making a circuit that increases drive strength of a digital logic circuit through the use of feedback, the method comprising:
    providing delay circuitry operative to receive and delay an output signal from an output terminal of said digital logic circuit;
    providing at least one drive transistor operative to source supplemental drive current to said digital logic circuit; and
    providing logic circuitry operative to receive a first input signal from an input terminal of said digital logic circuit and a second input signal from an output terminal of said delay circuitry, and turn "ON" said at least one drive transistor responsive to a digital state transition of said first input signal and turn "OFF" said at least one drive transistor responsive to a digital state transition of said second input signal, wherein said logic circuitry turns "OFF" said at least one drive transistor at substantially the same time that an output signal digital state transition at said output terminal of said digital logic circuit completes.

51. The method of claim 50 wherein said providing delay circuitry comprises providing delay circuitry operative receive, delay, and digitally invert said output signal of said digital logic circuit.

52. The method of claim 50 wherein said providing delay circuitry comprises providing delay circuitry operative to transition digital states at said output terminal of said delay circuitry an amount of time before an output signal digital state transition is complete at said output terminal of said digital logic circuit, whereby said logic circuitry turns "OFF" said at least one drive transistor once said output signal digital state transition is complete.

53. The method of claim 50 wherein said providing at least one drive transistor comprises providing at least one drive transistor operative to source supplemental drive current to said digital logic circuit during an output signal transition from a digital "1" to a digital "0" at said output terminal of said digital logic circuit.

54. The method of claim 50 wherein said providing at least one drive transistor comprises providing at least one drive transistor operative to source supplemental drive current to said digital logic circuit during an output signal transition from a digital "0" to a digital "1" at said output terminal of said digital logic circuit.

55. The method of claim 50 wherein providing logic circuitry comprises providing at least one digital logic NAND gate.

56. The method of claim 50 wherein providing logic circuitry comprises providing at least one digital logic NOR gate.

57. The method of claim 50 wherein a signal at said output terminal of said delay circuitry changes digital states at a time before said digital state transition completes at said output terminal of said digital logic circuit, said time being equal to about a time required for said signal at said output terminal of said delay circuitry to propagate through said logic circuitry to turn "OFF" said at least one drive transistor.

58. The method of claim 50 wherein providing delay circuitry comprises providing delay circuitry comprising a plurality of logic inverters connected in series.

* * * * *

UNITED STATES PATENT AND TRADEMARK OFFICE
CERTIFICATE OF CORRECTION

PATENT NO. : 6,909,308 B2
DATED : June 21, 2005
INVENTOR(S) : Hunt, Kenneth S.

It is certified that error appears in the above-identified patent and that said Letters Patent is hereby corrected as shown below:

Title page,
Item [74], *Attorney, Agent, or Firm*, should read:
-- Fish & Neave IP Group of
   Ropes & Gray LLP; Evelyn C. Mak --.

Column 1,
Line 36, delete "," after ""1"".

Column 4,
Line 50, change ""1"" to -- "0" --.

Column 11,
Line 4, change the second occurrence of ""1"" to -- "0" --.

Column 14,
Line 40, insert -- to -- before "turn".

Signed and Sealed this

Twenty-first Day of February, 2006

JON W. DUDAS
*Director of the United States Patent and Trademark Office*